(12) United States Patent
Klick et al.

(10) Patent No.: US 10,867,825 B2
(45) Date of Patent: Dec. 15, 2020

(54) WAFER BOAT AND TREATMENT APPARATUS FOR WAFERS

(71) Applicant: Wilfried Lerch, Dornstadt (DE)

(72) Inventors: Michael Klick, Berlin (DE); Ralf Rothe, Berlin (DE); Wilfried Lerch, Dornstadt/Tomerdingen (DE); Johannes Rehli, Blaubeuren (DE)

( * ) Notice: Subject to any disclaimer, the term of this patent is extended or adjusted under 35 U.S.C. 154(b) by 286 days.

(21) Appl. No.: 15/563,662

(22) PCT Filed: Mar. 31, 2016

(86) PCT No.: PCT/EP2016/057173
§ 371 (c)(1),
(2) Date: Oct. 2, 2017

(87) PCT Pub. No.: WO2016/156551
PCT Pub. Date: Oct. 6, 2016

(65) Prior Publication Data
US 2018/0076071 A1    Mar. 15, 2018

(30) Foreign Application Priority Data
Apr. 2, 2015  (DE) .................. 10 2015 004 352

(51) Int. Cl.
*H01L 21/673* (2006.01)
*H01J 37/32* (2006.01)
(Continued)

(52) U.S. Cl.
CPC .... *H01L 21/67313* (2013.01); *C23C 16/4587* (2013.01); *C23C 16/505* (2013.01);
(Continued)

(58) Field of Classification Search
USPC ................................. 118/715–733
See application file for complete search history.

(56) References Cited

U.S. PATENT DOCUMENTS 4,610,748 A * 9/1986 Engle .................. B05C 13/02
118/50.1
4,799,451 A * 1/1989 Gardner ................ C23C 16/505
118/500
(Continued)

FOREIGN PATENT DOCUMENTS

DE    102011109444    2/2013

OTHER PUBLICATIONS

English Machine Translation DE102011109444 Heintze et al (Year: 2013).*

*Primary Examiner* — Rakesh K Dhingra
(74) *Attorney, Agent, or Firm* — Tarolli, Sundheim, Covell & Tummino LLP

(57) ABSTRACT

A wafer boat is described for the plasma treatment of disc-shaped wafers, in particular semiconductor wafers for semiconductor or photovoltaic applications, which has a plurality of plates positioned parallel to each other made of an electrically conductive material, which have at least one carrier for a wafer on each side which faces another plate and define a receiving space for the wafers on the plates. The wafer boat also has a plurality of spacer elements, which are positioned between directly adjacent plates in order to position the plates parallel to each other, wherein the spacer elements are electrically conductive. Also a plasma treatment apparatus for wafers and a method for the plasma treatment of wafers is described. The apparatus has a process chamber for the reception of a wafer boat of the previously described type, means for controlling or regulating a process gas atmosphere in the process chamber and at least one voltage source, which is connectable to the plates of the wafer boat in a suitable manner, in order to apply an electrical voltage between directly adjacent plates of the wafer boat, wherein the at least one voltage source is suitable for applying at least one DC-voltage or at least one
(Continued)

low-frequency AC-voltage and at least one high-frequency AC-voltage. In the method, during the heating phase a DC-voltage or a low-frequency AC-voltage is applied to the plates of the wafer boat in such a way that the spacer elements heat up by current flowing therethrough, and during a processing phase a high-frequency AC-voltage is applied to the plates of the wafer boat, in order to generate a plasma between the wafers inserted into them.

17 Claims, 14 Drawing Sheets

(51) Int. Cl.
*H01L 21/67* (2006.01)
*C23C 16/458* (2006.01)
*C23C 16/505* (2006.01)
*H01L 21/324* (2006.01)
*H01L 21/677* (2006.01)
*H01L 21/02* (2006.01)
*H01L 21/687* (2006.01)

(52) U.S. Cl.
CPC .... *H01J 37/3299* (2013.01); *H01J 37/32715* (2013.01); *H01J 37/32724* (2013.01); *H01J 37/32733* (2013.01); *H01J 37/32908* (2013.01); *H01L 21/324* (2013.01); *H01L 21/67109* (2013.01); *H01L 21/67754* (2013.01); *H01L 21/02123* (2013.01); *H01L 21/67383* (2013.01); *H01L 21/67757* (2013.01); *H01L 21/68771* (2013.01)

(56) References Cited

U.S. PATENT DOCUMENTS

| | | | | | |
|---|---|---|---|---|---|
| 4,873,942 | A | * | 10/1989 | Engle | C23C 16/509 |
| | | | | | 118/728 |
| 5,356,475 | A | * | 10/1994 | Diiorio | C23C 16/4587 |
| | | | | | 118/715 |
| 2002/0053513 | A1 | * | 5/2002 | Stimson | H01J 37/32431 |
| | | | | | 204/298.15 |
| 2003/0024920 | A1 | * | 2/2003 | Ratliff | C23C 16/455 |
| | | | | | 219/390 |
| 2005/0115830 | A1 | * | 6/2005 | Furukawa | C23C 14/568 |
| | | | | | 204/298.25 |
| 2005/0188923 | A1 | * | 9/2005 | Cook | C23C 16/4584 |
| | | | | | 118/728 |
| 2015/0201468 | A1 | * | 7/2015 | Yonenaga | H05B 6/105 |
| | | | | | 219/634 |

* cited by examiner

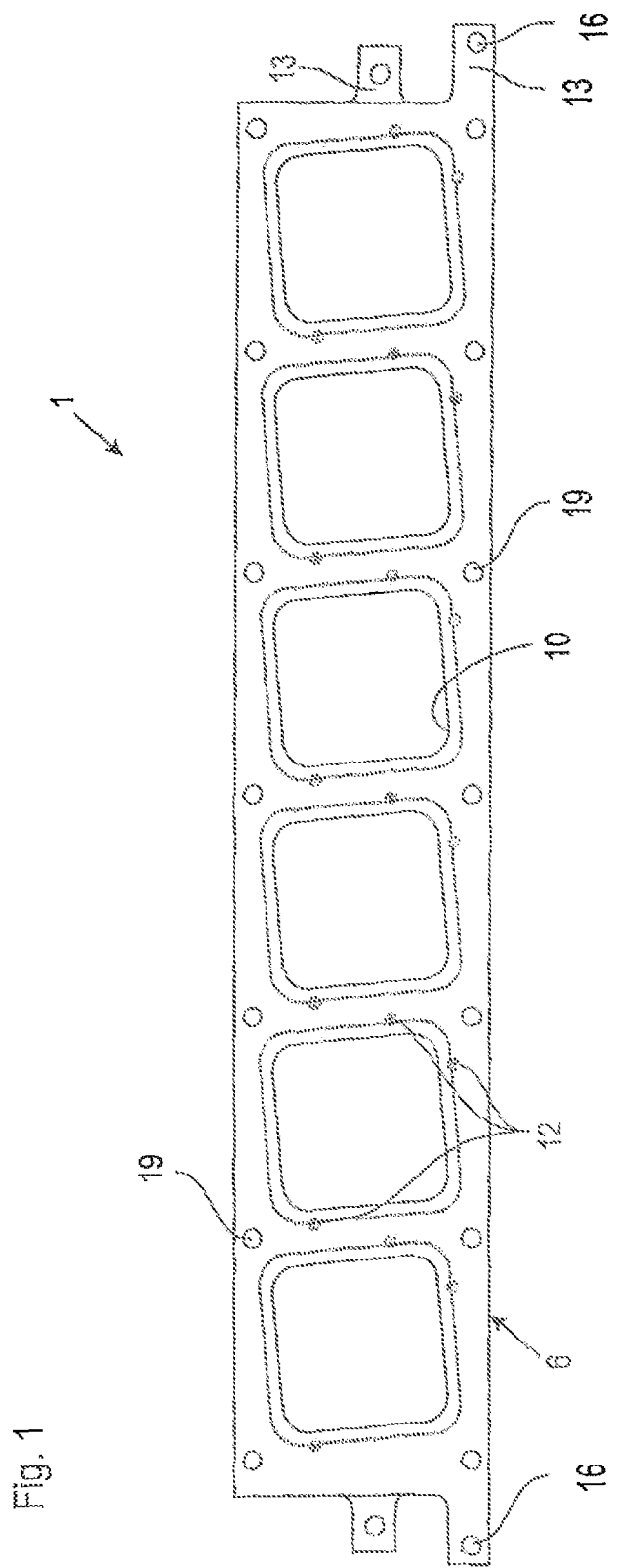

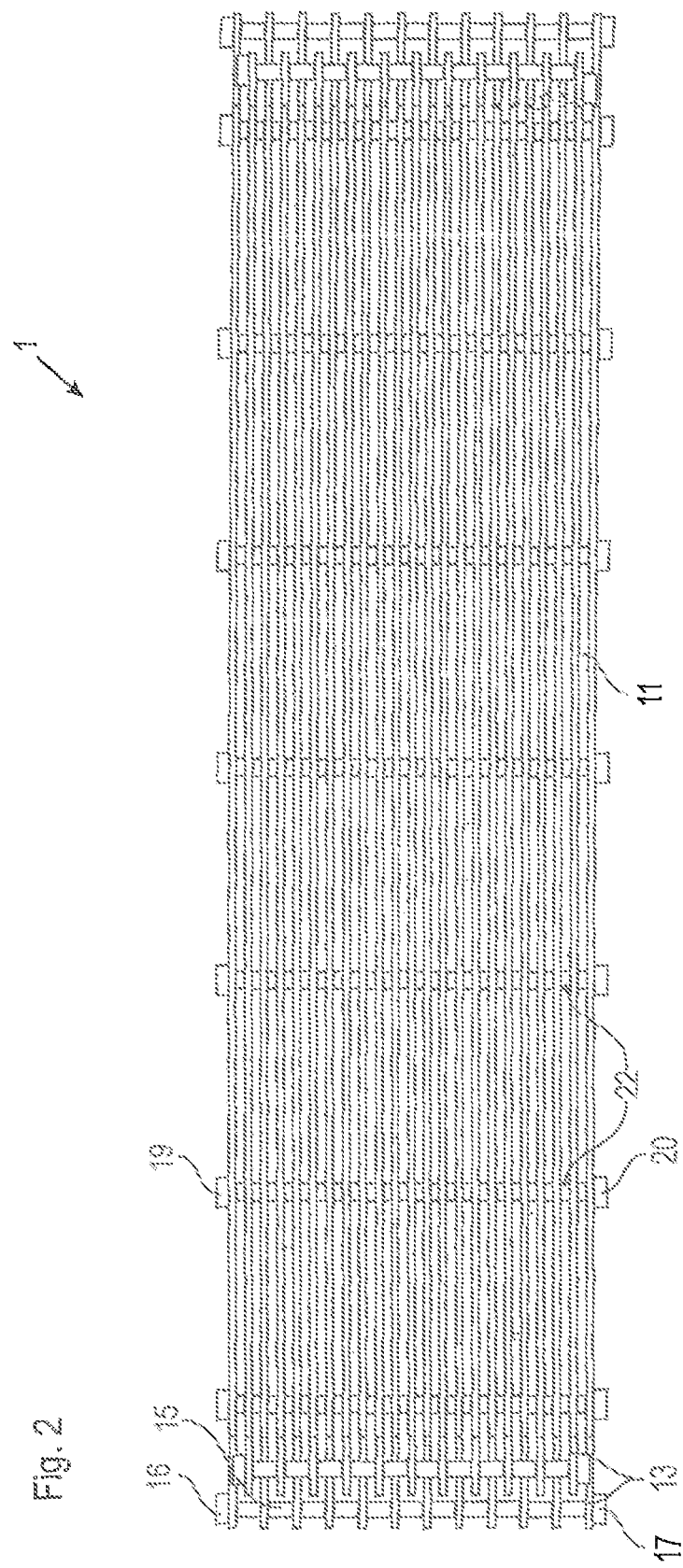

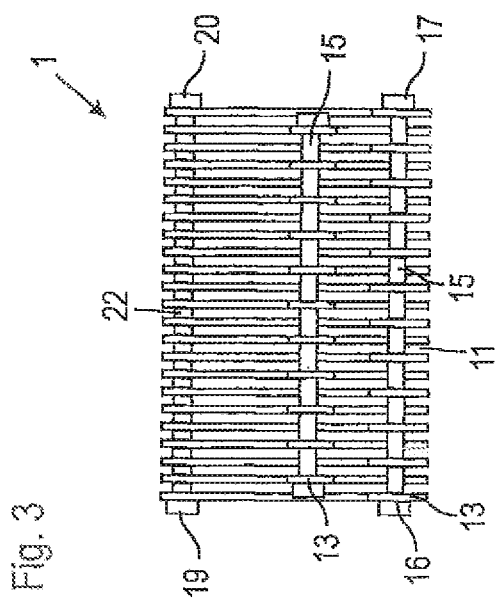

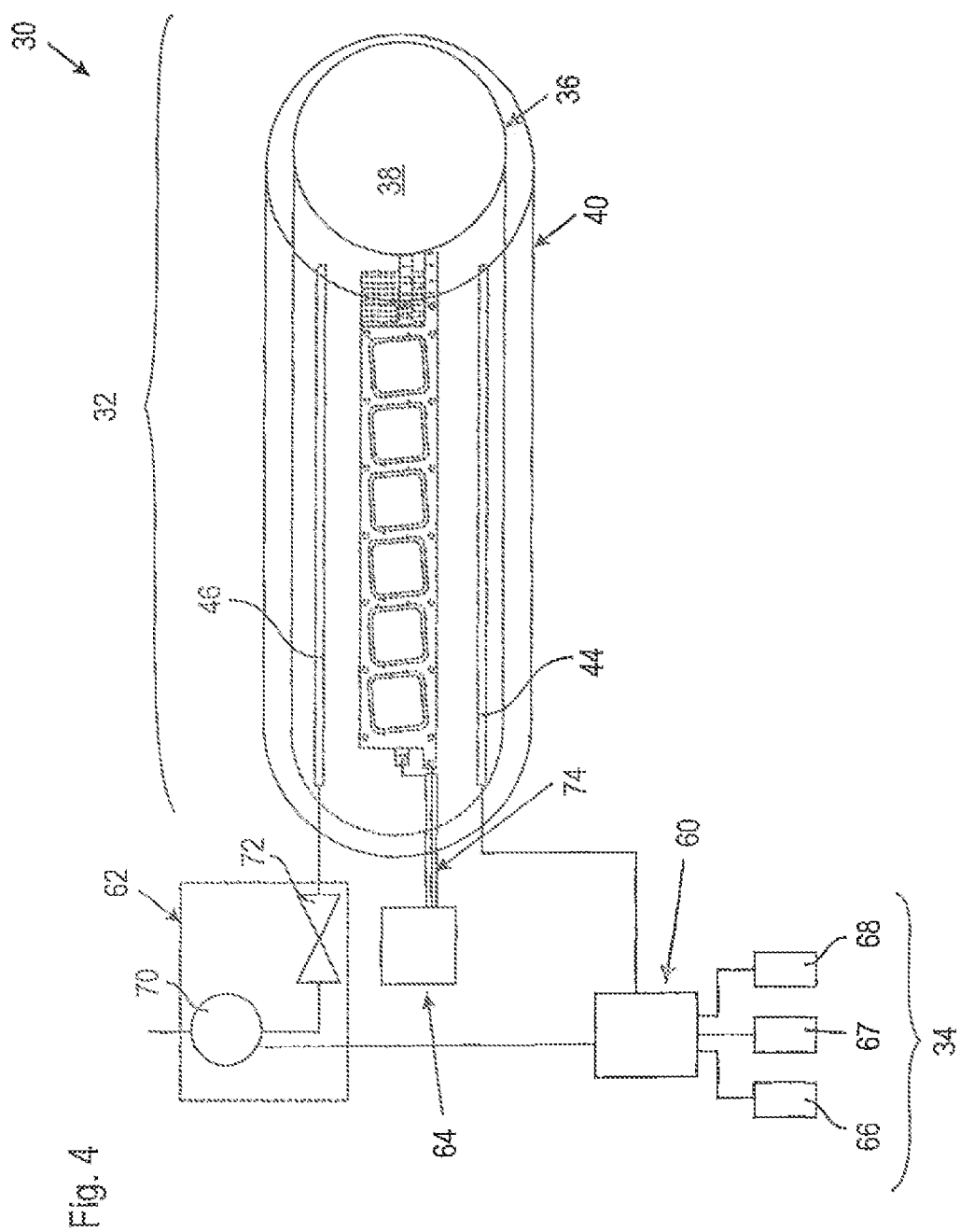

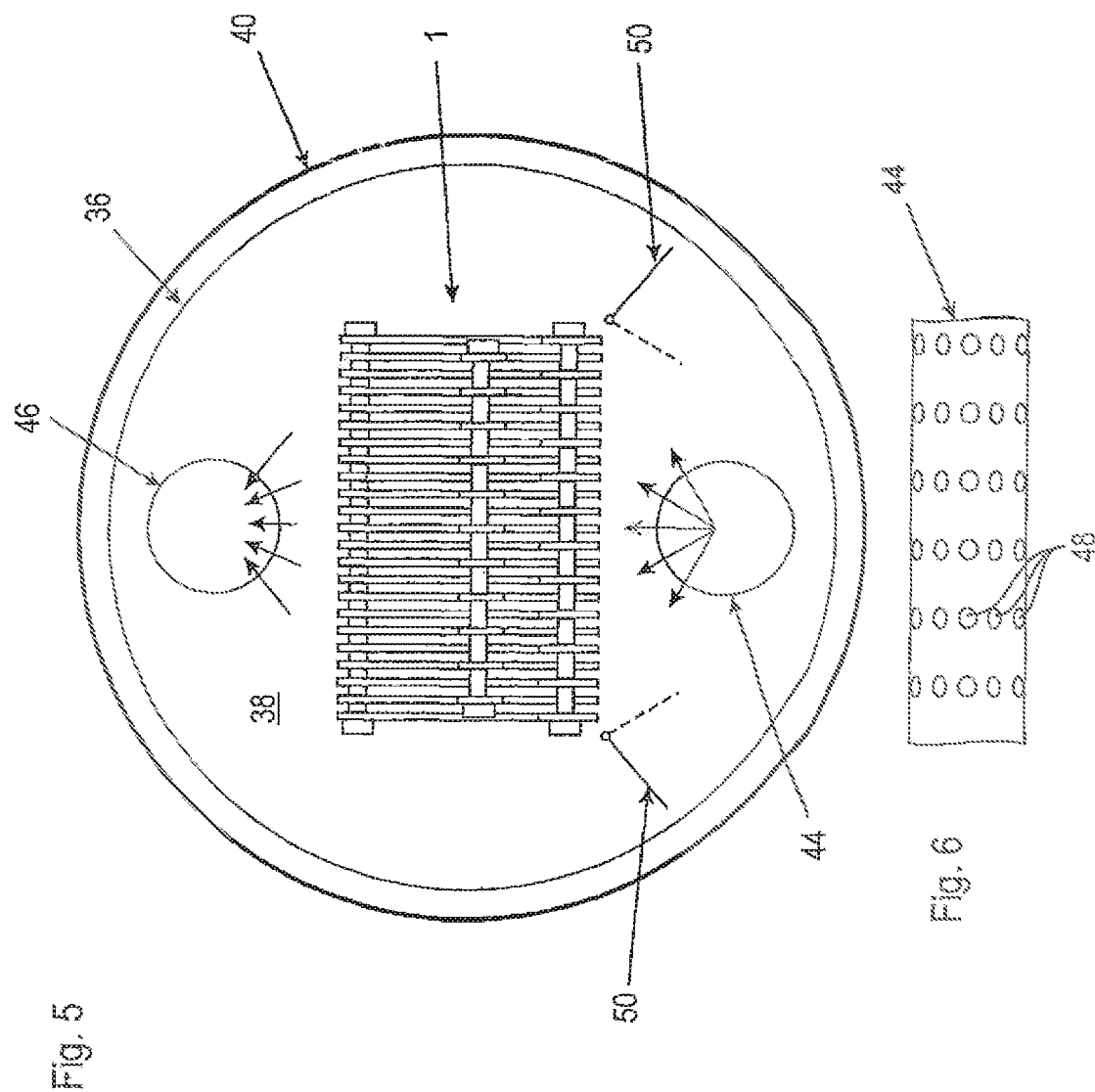

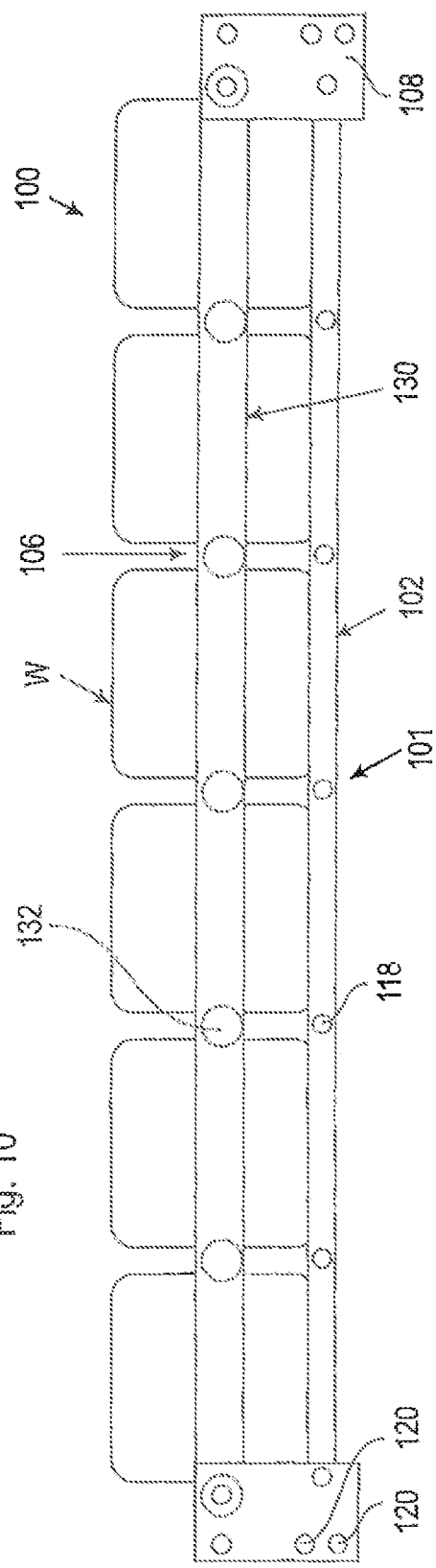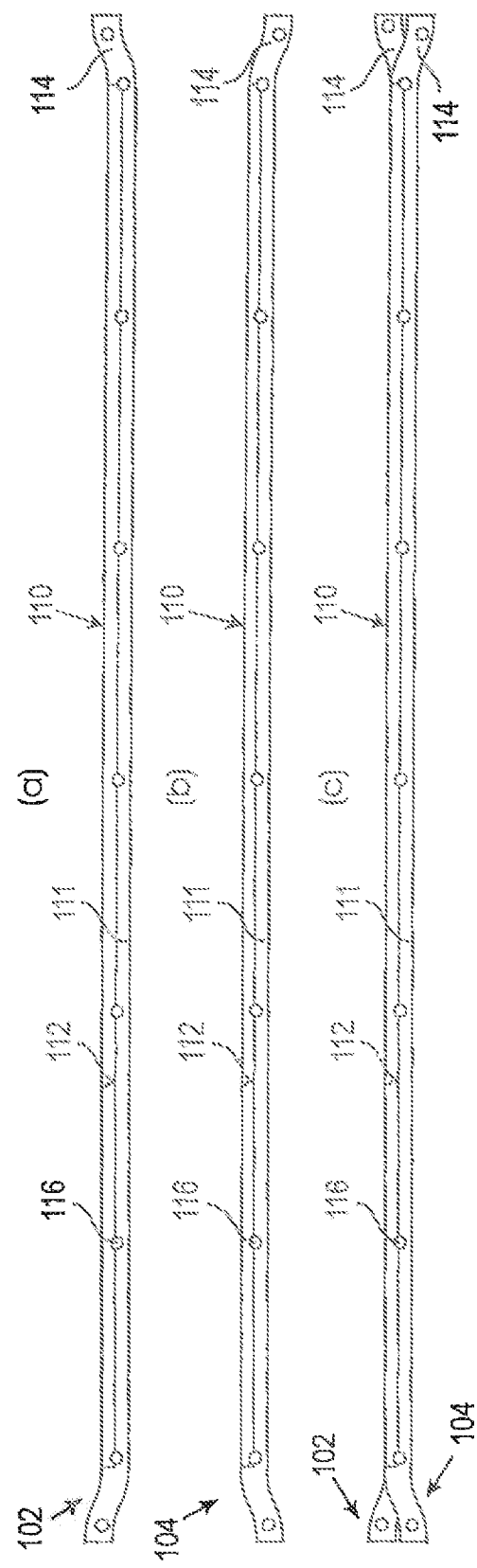

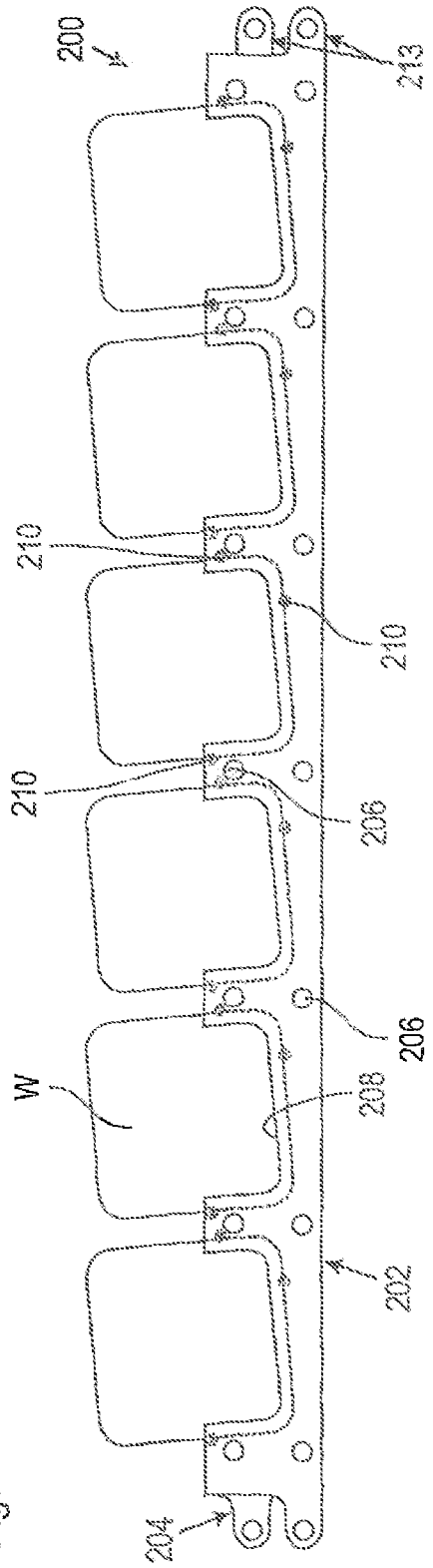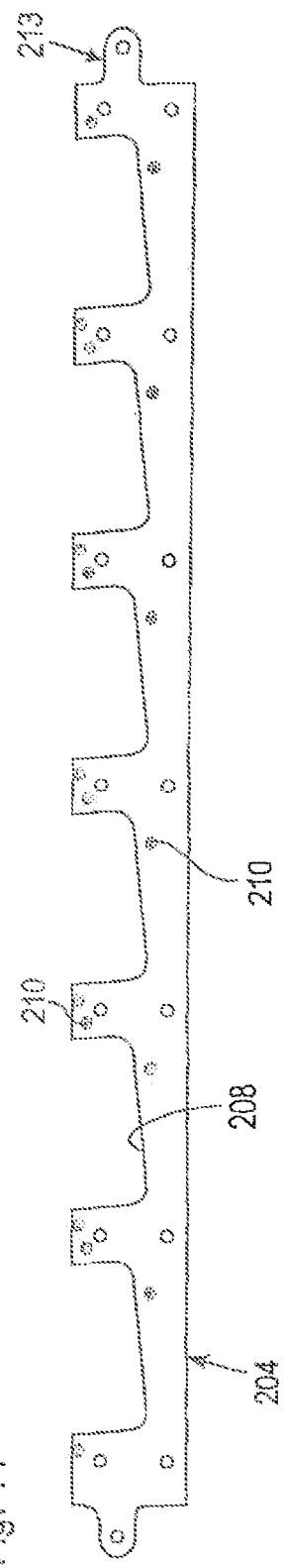
Fig. 13
Fig. 14

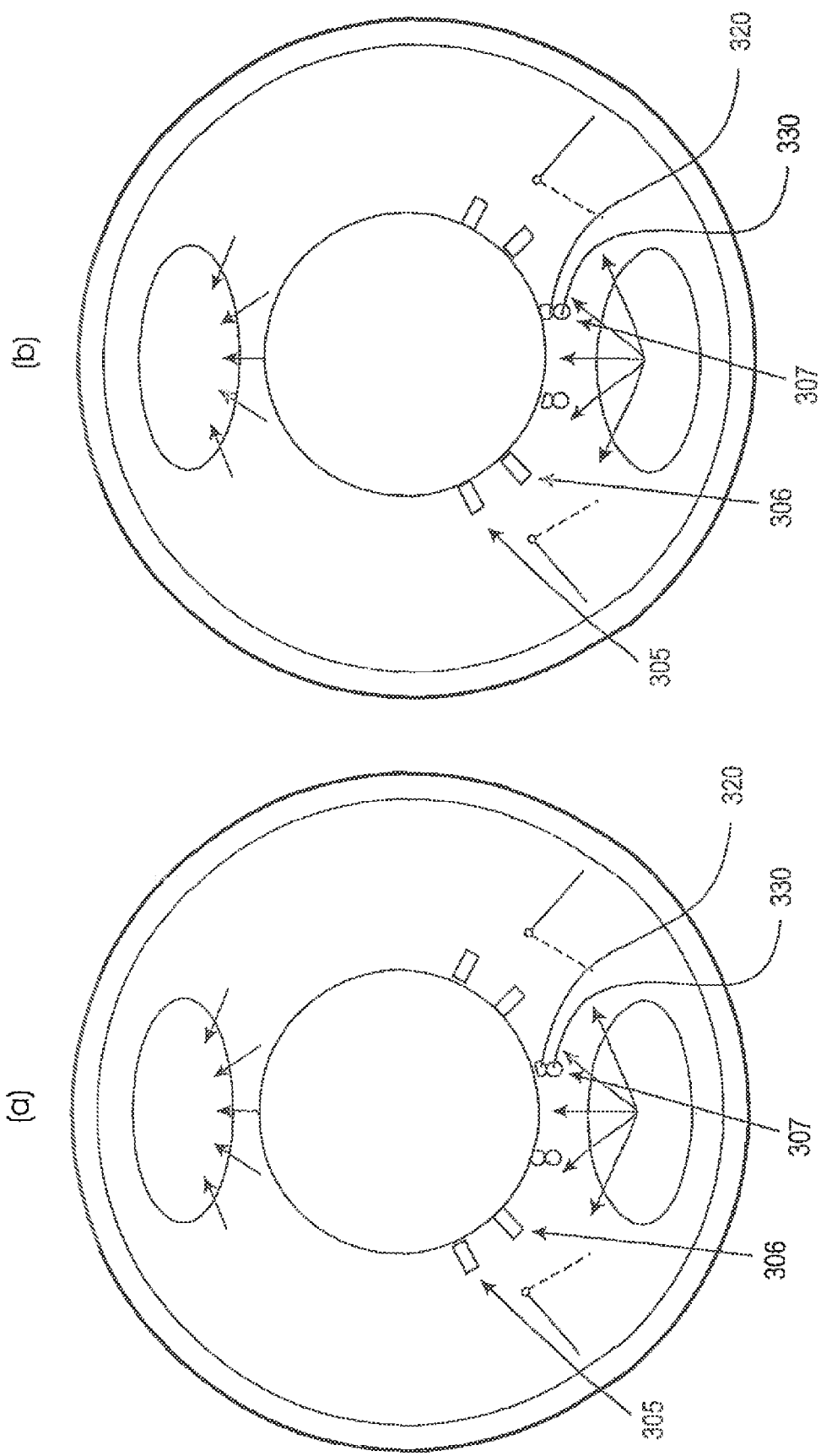

WAFER BOAT AND TREATMENT APPARATUS FOR WAFERS

RELATED APPLICATIONS

This application corresponds to PCT/EP2016/057173, filed Mar. 31, 2016, which claims the benefit of German Application No. 10 2015 004 352.8, filed Apr. 2, 2015, the subject matter of which are incorporated herein by reference in their entirety.

BACKGROUND OF THE INVENTION

The present invention concerns a wafer boat and a treatment apparatus for wafers, which are suitable for generating a plasma between wafers received therein.

In semiconductor and solar cell technology it is well known that disc-shaped substrates made of various materials, which, independently of their geometric shape and material, are referred to as wafers in the following, are submitted to different processes.

In this regard, wafers are submitted frequently to single treatment processes as well as batch processes, that is, processes in which several wafers are treated simultaneously. Both for single processes and for batch processes the wafers must in each case be moved into a desired treatment position. In batch processes this is usually achieved by placing the wafer in so-called boats, which have spaces for a plurality of wafers. In the boats, the wafers are usually placed parallel to one another. Such boats can be built in various different ways, and frequently the design is such that only the bottom edges of the wafers are held in the boat, letting the wafer stand freely upright. Such boats can for example comprise lead-in chamfers so as to facilitate the placement of the bottom edges of the wafers into the boats. Such boats are usually passive, that is, apart from providing a holding function they have no further function during the processing of the wafers.

In the case of one type of wafer boat, which is for example used for a plasma processing of wafers in semiconductor or solar cell technology, the wafer boat is formed from a plurality of electrically conductive plates, which are normally made of graphite. The plates are substantially positioned parallel to one another and carrier slits are formed between adjacent plates for holding wafers. The sides of the plates which face one another each have respective carrier elements for wafers, so that wafers can be received at each of these sides. As carrier elements pins are usually provided at each plate side which faces another plate, which pins may receive the wafers. In this way, at least two wafers can be completely accommodated in each carrier slit between the plates in such a way that they face each other. Adjacent plates of the wafer boat are electrically isolated from one another, and during the process an AC voltage is applied between directly adjacent plates, usually in the kHz or MHz region. In this way a plasma can be generated between the plates and in particular between the wafers which are held at the respective plates, in order to provide a plasma treatment such as for example a deposition from the plasma or a plasma nitriding of films. For the arrangement of the plates next to one another, spacer elements are used, which have a pre-designated length for adjusting a pre-designated distance between the plates. An example of such a wafer boat, which comprises plates and spacer elements, is described in DE 10 2011 109 444 A1. In particular, electrically insulating spacer elements and insulating mounting elements are used for the electrical insulation of adjacent plates, which have special discharge openings for etching or washing fluids. In addition, electrically conductive elements are used at the contact ends of the plates, in order e.g. to apply the same potential to every second plate. These conductive elements have a resistance which is as low as possible, in order to enable a uniform treatment of the plates.

For a deposition from the plasma it is normally additionally necessary to heat the wafer to a pre-determined temperature. To this end, the wafer boat, and the wafers inserted into it, are normally inserted into a processing tube which may be heated by means of a heating device. During the heating, not only the wafers, but also the wafer boat, which comprises a high thermal mass, is heated. Although the temperature at the outer plates can be reached quite quickly, the heating of the inner plates and the inner wafers can sometimes take quite a long time, which extends the process cycles.

The aim of the present invention is to provide a wafer boat and a method for the plasma treatment of wafers which enable an improved heating of the wafers.

SUMMARY OF THE INVENTION

According to the invention, this aim is achieved by a wafer boat according to claim 1, a plasma treatment device according to claim 10 and a method according to claim 12. Further embodiments of the invention may be derived from the dependent claims.

In particular a wafer boat for the plasma treatment of disc-shaped wafers, in particular semiconductor wafers for semiconductor or photovoltaic applications, is provided. The wafer boat comprises a plurality of plates which are arranged parallel to each other, are made of an electrically conductive material, and which have at least one carrier or receptacle for a wafer at each side, which faces another plate, and a plurality of spacer elements which are arranged between directly adjacent plates, to position the plates parallel to each other, wherein the spacer elements are electrically conductive. Unlike normal wafer boats, which have a similar design, the spacer elements in this case are electrically conductive, which allows their use as resistance heating elements in a heating phase of a wafer treatment. In this manner a short heating phase can be achieved, since the spacer elements can emit heat in a targeted manner into the gaps between the plates.

For a homogeneous heating, the spacer elements can be positioned evenly around the receiving space for the wafers at the plates. Preferably, at least four of the spacer elements are positioned around a respective receiving space for the wafers at the plates.

In one embodiment, the spacer elements have a resistance of at least 20 kΩ, and preferably in the region of 40 kΩ, so that they can be used as resistance heating elements, but also so that they do not substantially influence a wave propagation between the plates during a high frequency application. To achieve a good adjustability of the desired resistance and in order to avoid contamination of the treatment process, the spacer elements can be made of polysilicon, wherein the resistance of the spacer elements can be set by doping the base material. The resistance of the spacer elements is preferably selected such that when a high frequency voltage is applied to the wafer boat, only the minor part (i.e. less than 50% and preferably less than 30%) of the introduced high frequency power is turned into heat at the spacer elements.

Preferably, the plates have contact projections at their longitudinal ends which are connected by contact blocks with the contact projections of other plates, wherein the contact projections of directly adjacent plates lie on different height levels and the contact blocks in each case connect every second one of the plates. This is an easy way to apply a voltage between the plates, in order both to heat up the spacer elements and/or to generate a plasma between the plates and in particular between the wafers situated on the plates. Preferably, the combined thermal mass of the sum of the contact blocks and the sum of the contact projections is smaller than the thermal mass of the rest of the wafer boat. In particular, the combined thermal mass of the sum of the contact blocks and the sum of the contact projections is smaller than 1/10 of the thermal mass of the rest of the wafer boat, in order to facilitate a fast heating. In addition it is preferred that the impedance of the supply path along the respective electrically conductive contact blocks and two contact projections is less than the impedance of a plasma which burns between one wafer pair which is in contact with the contact projections, in order to avoid excessive losses in the region of the contact arrangement in the case of high frequency applications.

The plasma treatment apparatus comprises a process chamber for receiving a wafer boat as described above, means of controlling or regulating a process gas atmosphere in the process chamber and at least one voltage source, which is connectable to the plates in the wafer boat in a suitable manner, so as to apply an electrical voltage between directly adjacent plates of the wafer boat, wherein the at least one voltage source is suitable for applying at least one of a DC voltage and a low-frequency AC voltage and a high-frequency AC voltage. In this way it is possible to apply different voltages to the wafer boat, to on one hand use the spacer elements as resistance heating elements during the heating phase, applying DC voltage or low-frequency AC voltage, and on the other hand to generate a plasma between the plates during the processing phase, applying a high-frequency AC voltage. To heat up the process chamber and the wafer boat within the process chamber quickly, an additional heating unit may also be provided. The process chamber can have both a horizontal and a vertical orientation.

In a method for plasma treatment of wafers, a plurality of wafers received in a wafer boat of the type described above is inserted into the process chamber of a plasma treatment apparatus of the type described above. Next, during a heating phase, a DC voltage or a low-frequency AC voltage is applied to the plates of the wafer boat in such a way that the spacer elements are heated by electrical current flowing therethrough. During a processing phase a high-frequency AC voltage is supplied to the plates of the wafer boat in order to generate a plasma between the wafers received on the plates. This enables a short heating phase to be achieved, since during the heating phase, the spacer elements are able to give off heat directly towards the inner plates or the wafers respectively.

Preferably, the temperature in the process chamber is controlled or regulated, and the changing between supplying of the DC voltage or the low-frequency AC voltage and supplying of the high-frequency AC voltage is carried out when the temperature of the wafers reaches or exceeds a pre-determined temperature. In an embodiment, in which it is not intended that heating should be carried out with a high-frequency AC voltage, or at least to a very minor extent, the applied DC voltage or low-frequency AC voltage is substantially larger than the high-frequency AC voltage, in particular by at least a factor of 2.

Preferably, the gas atmosphere in the process chamber is controlled or regulated and, in particular, during the heating phase and the processing phase different gas atmospheres are set, wherein the gas atmospheres can be different both in terms of the composition of the gas as well as in terms of the pressure. For example, during the heating phase an inert gas at a first pressure is preferred, and during the processing phase a reactive gas or gas mixture with a second pressure is preferred which is less than the first pressure.

BRIEF DESCRIPTION OF THE DRAWINGS

The invention will now be described in more detail with reference to the drawings; in the drawings:

FIG. 1 shows a schematic side view of a wafer boat;

FIG. 2 shows a schematic top view onto the wafer boat according to FIG. 1;

FIG. 3 shows a schematic front view of a wafer boat according to FIG. 1;

FIG. 4 shows a schematic view of a plasma treatment apparatus with the wafer boat according to FIG. 1 received therein;

FIG. 5 shows a schematic front view of a process chamber of the plasma treatment apparatus according to FIG. 4;

FIG. 6 shows a schematic top view onto a part of the gas supply of the process chamber according to FIG. 5;

FIG. 10 shows a schematic side view of an alternative wafer boat for use in a plasma treatment apparatus;

FIG. 11($a$) to ($c$) show schematic side views of parts of the alternative wafer boat according to FIG. 9, separately and in their final composition;

FIG. 13 shows a schematic side view of a further alternative wafer boat for use in a plasma treatment apparatus; and FIG. 14 shows a schematic side view of a part of the alternative wafer boat according to FIG. 12;

FIGS. 20($a$) and ($b$) show schematic cross-sectional views through a process chamber of a plasma treatment apparatus according to FIG. 4 with a wafer boat according to FIG. 18 received therein.

DESCRIPTION

Figure 8:
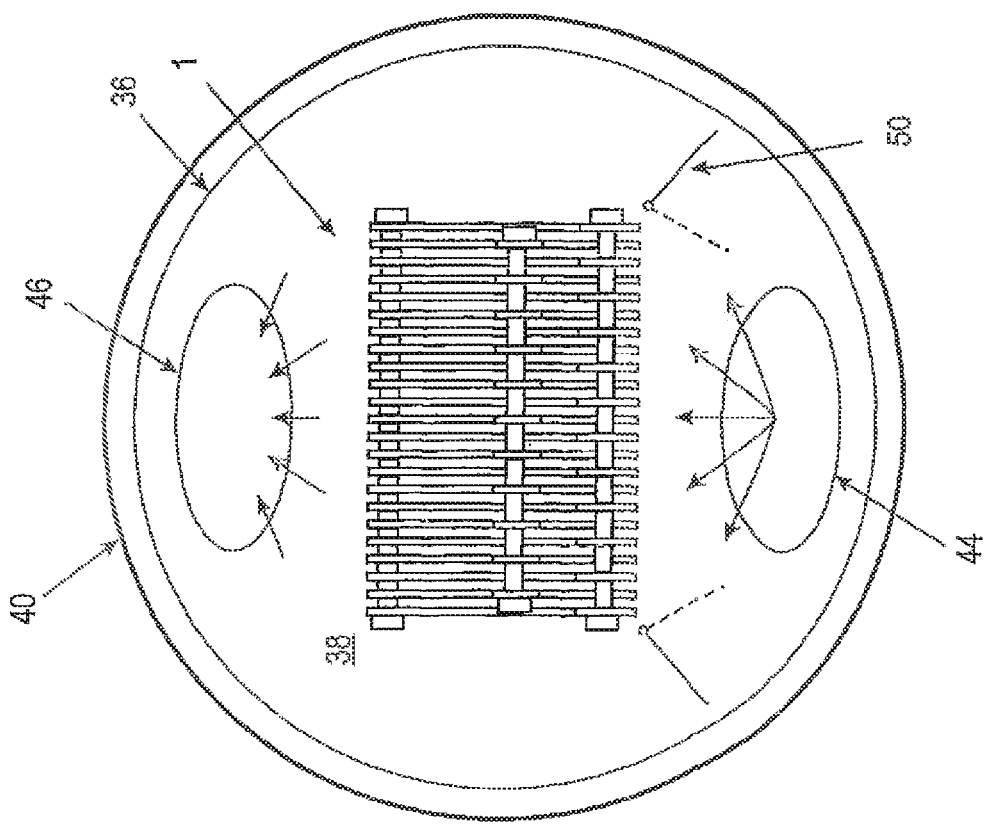
FIG. 8 shows a schematic front view of a further alternative process chamber of the plasma treatment apparatus according to FIG. 4.

Terms used in the description, such as "above", "below", "left" and "right", relate to the drawings and are not to be intended to be restricting. They can however describe preferred embodiments. The term "substantially" relating to parallel, vertical or angle measurements should include deviations of ±3°, preferably ±2°. In the following descriptions the term "wafer" will be used for disc-shaped substrates, which are preferably semiconductor wafers for semiconductor or photovoltaic applications, although substrates made of other materials can also be provided and processed.

In the following descriptions the basic structure of a wafer boat 1 for use in a plasma treatment apparatus will be more closely described with reference to FIGS. 1-3, wherein FIG. 1 shows a schematic side view of a wafer boat 1 and FIGS. 2 and 3 show a top view and a front view. In the figures the same reference signs will be used inasmuch as they describe the same or similar elements.

The wafer boat 1 is composed of a plurality of plates, contacting elements and clamping units. The shown wafer boat 1 is particularly suitable for a film deposition from a plasma, e.g. of $Si_3N_4$, $SiN_x$, a-Si, $Al_2O_3$, $AlO_x$, doped and undoped polysilicon or amorphous silicon etc. and in particular for the plasma nitriding of wafers.

The plates 6 each consist of an electrically conductive material and in particular they are formed as graphite plates, although, depending on the process, a coating or surface treatment of the plate basic material can be carried out. The plates 6 each have six apertures 10 which are covered by the wafers during the process, as will be described in more detail hereafter. Although in the shown form six apertures per Plate 6 are provided it should be noted that a larger or smaller number of apertures can be provided. The plates 6 each have upper and lower edges, wherein in the upper edge e.g. a plurality of notches can be formed, in order to facilitate the position detection of the plates, such as is described in DE 10 2010 025 483.

In the depicted embodiment there are in total 23 plates 6, which are substantially arranged in parallel to one another by means of corresponding contact units and clamping units, in order to form carrier slits 11 between the plates 6. In the case of 23 plates 6 there are 22 carrier slits 11. In practice however, 19 or 21 plates are frequently used, and the invention is not restricted to a particular quantity of plates.

The plates 6 have, at least on their respective side which faces an adjacent plate 6, groups of three respective carrier elements 12 which are positioned such that they can receive a wafer between them. The groups of the carrier elements 12 are each positioned around each aperture 10, as schematically indicated in FIG. 1. The wafers can be inserted in such a way that the carrier elements in each case come into contact with a different side edge of the wafer. In the longitudinal direction of the plate elements (corresponding to the apertures 10) there are in total six respective groups of carrier elements provided for the reception of a semiconductor wafer.

At the ends of plates 6 there is in each case a protruding contact projection 13 which serves for electrically contacting the plates 6, as will be more closely described hereafter. Two embodiments of plates 6 are provided, which differ in the position of the contact projections 13. In one embodiment, the contact projections 13 respectively protrude directly adjacent to the bottom edge, whereas in the other embodiment they protrude at a distance from the bottom edge, wherein the distance to the bottom edge is greater than the height of the contact projections 13 of the plates of the other embodiment. The two embodiments of plates 6 are positioned in an alternating manner in the wafer boat 1. As can most clearly be seen in the view according to FIG. 2, the contact projections 13 of directly adjacent plates 6 lie on different height levels of the wafer boat. In the case of every second plate 6, the contact projections 13 are however on the same height level. In this way, two spaced contact levels are created by means of the contact projections 13. This apparatus enables directly adjacent plates 6 to be supplied with different potential, while every second plate can be supplied with the same potential.

The contact projections 13 which lie on one contact level are electrically connected by means of contact blocks 15, made of a material of good electrical conductivity, in particular graphite, and are positioned at a predetermined distance from one another. In the region of the contact projections 13 and in each of the contact blocks 15 at least one through opening is provided. These enable the insertion of a clamping element 16 when they are lined up, which has a shaft section (not visible) and a head section, such as e.g. a screw. By means of a counter element, such as a nut 17, which acts or sits on the free end of the shaft section the plates 6 can be fixed to one another. The plates are fixed together in two different groups in such a way that the plates of the different groups are positioned in alternation. The clamping element 16 can be made of an electrically conductive material, but this is not obligatory. The contact blocks 15 each have preferably the same length (in the direction which defines the distance between the contact projections 13 of the plates 6) and this should equal the width of two carrier slits 11 plus the width of one plate 6. The contact blocks 15 are preferably designed in such a way that they have a low thermal mass and in particular the sum of the contact blocks should have a lower thermal mass than the sum of the plates 6. More preferably, the combined thermal mass of the sum of the contact blocks and the sum of the contact projections 13 should be smaller than the thermal mass of the sum of the plates 6 minus the thermal mass of the contact projections 13.

In addition, further through openings are provided in the plates adjacent to the upper edge and the lower edge, wherein the through openings allow the insertion of a clamping element 19 which has a shaft section (not visible) and a head section, such as e.g. a screw of the clamping unit. These can in turn be combined with suitable counter elements 20 such as e.g. nuts. In the depicted embodiment, there are in each case seven through openings adjacent to the upper edge and seven through openings adjacent to the lower edge. Around each aperture 10 there are positioned, virtually symmetrically, four through openings. As a further part of the clamping unit there is provided a plurality of spacer elements 22, which are e.g. in the form of spacer sleeves with substantially the same length. The spacer elements 22 are positioned in each case in the region of the corresponding through openings between the directly adjacent plates 6.

The respective shaft sections of the clamping elements 19 are sized in such a way that they can extend through corresponding openings of all plates 6 as well as through the spacer elements 22 which are situated between the plates. In this way, by means of the at least one counter element 20, all plates 6 can substantially be fixed parallel to one another. Here, other clamping units could conceivably be used with spacer elements 22, which line up and clamp the plates 6 with the spacer elements 22 in a substantially parallel manner. In the depicted embodiment, there are 22 carrier slits and in total 14 spacer elements 22 per slit (seven at the upper edge and seven at the lower edge), making a total of 308 spacer elements.

The clamping elements 19 are preferably made of an electrically isolating material, but the spacer elements 22 should be preferably made of an electrically conductive material. In particular, the spacer elements 22 should be made of a high-resistance material such that the spacer elements can serve as a resistance element when a low DC voltage or a low-frequency AC voltage with sufficient amplitude is supplied, but when a high-frequency AC voltage is applied (for the generation of a plasma between the plates) that there is no significant damping of the wave propagation. For a low-frequency voltage, a frequency range of 50 Hz-10 KHz is considered, and for the high-frequency voltage a frequency range of more than 40 KHz is considered, although also other frequency ranges would be possible. In the depicted embodiment with the selected distribution, each spacer element should have a resistance of e.g. 3 k$\Omega$, in particular more than 20 k$\Omega$ or even more than 40 k$\Omega$. For example the spacer elements can be made of doped silicon, polysilicon or another suitable material, which on one hand is not affected by the process and on the other side does not affect the process, and in particular does not introduce any impurities into the process. While the plates 6 of one group (upper contact projections 13/lower contact projections 13) are electrically connected and fixed to one another via contract elements 15, all plates are electrically connected and fixed to one another by means of the spacer elements 22.

In the following, the basic structure of a plasma treatment device 30, in which a wafer boat 1 of the above-mentioned type can be used (but also a conventional wafer boat), will be described in more detail referring to FIGS. 4 to 6, wherein FIG. 4 shows a schematic side view of the treatment apparatus 30, FIG. 5 shows a schematic front view of a process chamber construction and FIG. 6 shows a top view onto a gas supply.

The treatment apparatus 30 comprises a process chamber section 32 and a control section 34. The process chamber section 32 comprises a tube element 36 closed on one side which forms in its interior a process chamber 38. The open end of the tube element 36 serves for loading the process chamber 38, and it can be shut and hermetically sealed by means of a closing mechanism (not shown), as is known in this field of technology. The tube element is made of a suitable material which does not introduce impurities into the process, is electrically insulated and can withstand the process conditions with regard to temperature and pressure (vacuum), such as e.g. quartz. At its closed end, the tube element 36 comprises gas-tight passages for the introduction and removal of gases and electricity, which can be designed in the usual manner. Corresponding supply-lines and discharge-lines could however be situated at the other end or even also at the side at a suitable position between the ends.

The tube element 36 is surrounded by a jacket 40 which insulates the tube element 36 thermally from its environment. Between the jacket 40 and the tube element 36 a heating device is provided (not shown in detail), such as a resistance heater, which is suitable for heating up the tube element 36. However, such a heating device can e.g. also be situated in the interior of the tube element 36, or the tube element 36 could itself be designed as a heating element. At the present time, however, an externally situated heating element is preferred and, in particular, one which comprises different, individually controllable heating circuits.

In the interior of the tube element 36 are situated carrier elements (not shown in more detail) which form a holding plane for holding a wafer boat 1 (which is only partially shown in FIG. 4), which can e.g. be of the above-described type. The wafer boat can however also be placed in the tube element 36 in such a manner that it stands on the wall of the tube element 36. In this case the wafer boat will be substantially held above the reception plane and is positioned more or less centrally in the tube element, as can be seen e.g. in the front view in FIG. 5. Using suitable carrier elements and/or a direct placement on the tube element, a receiving space is defined in combination with the measurements of the wafer boat, in which is situated a properly inserted wafer boat. The wafer boat can be inserted into and taken from the process chamber 38 as a whole in a loaded state by means of a suitable handling mechanism (not shown). In this case, an electrical contact with at least one contact block 15, respectively, of each of the group of plates 6 will be made, when the wafer boat is loaded, as will be described in more detail hereafter.

In the interior of the tube element 36 are situated additionally a lower gas guide tube 44 and an upper guide tube 46, which are made of a suitable material such as quartz. The gas guide tubes 44, 46 extend in a longitudinal direction of the tube element 36 at least along the length of the wafer boat 1. The gas guide tubes 44, 46 each have a round profile and are situated in transverse direction approximately centrally above or below the wafer boat 1. The gas guide tubes 44, 46 are connected with a gas supply unit or gas exhaust unit at their end which is nearer to the closed end of the tube element 36, as will be explained in more detail hereafter. The respective other end of the gas guide tubes 44, 46 is closed. One could however consider also a short gas supply, in which case e.g. gas is pumped in only at one end of the tube element and is distributed by means of diffusion and/or is pumped by a vacuum port (preferably attached to the opposite end of the tube element 36).

The lower gas guide tube 44 has a plurality of openings 48 through which gas can exit the gas guide tube. The openings are all situated in the upper half of the gas guide tube, so that a gas, which is emitted from this tube, has a momentum which is directed in an upward direction. In particular it is considered to provide a plurality of rows of openings 48 which extend transversely to the longitudinal extension of the gas guide tube 44, wherein every row has e.g. five openings 48. In the top view according to FIG. 6, a section of a corresponding gas guide tube 44 is shown schematically. The openings should be situated longitudinal in a region of the gas guide tube 44, which is at least as long as the wafer boat. Preferably, the region is longer than the length of the wafer boat and is situated in such a way that the region extends beyond the ends of the wafer boat. Preferably, the sum of the surface area of the openings 48 is smaller than the cross-sectional area of the gas guide tube 44. Preferably, the relationship between the sum of the surface area of the openings 48 and the cross-sectional area of the gas guide tube 44 is between 30 and 70% and in particular between 40 and 60%. When a gas is supplied, a constant pressure is created in the gas guide tube 44, and a uniform gas distribution can be achieved across the area populated with openings. In particular, when the diameter of each opening is approximately 1.5 mm, it should be considered to space the rows of openings 48 by approximately 5 mm. This measurement extends between the central points of each opening of the different rows. The distance can however also be different and in particular in the case of lower pressures, the distance can be larger. A distance of less than 5 cm should be preferred, still more so a distance of less than 2 cm, and particularly one of less than 1 cm.

The upper gas guide tube 46 has a similar construction with openings, although the openings in this case are situated in the lower half. The gas guide tubes 44, 46 can be in substance identical, apart from the fact that they are arranged in a different orientation, so that the respective openings open towards the wafer boat. Thus, the openings in the lower gas guide tube 44 and the openings in the upper gas guide tube 46 open towards the receiving space, that is, the region in which a properly inserted wafer boat has been situated. Instead of providing rows of five openings each, it is also possible to provide a different layout or also different shapes of openings, e.g. slits.

By means of such gas guide tubes 44, 46 a good, homogeneous gas distribution can be achieved within the process chamber and in particular also in the carrier slits 11 of the wafer boat. To achieve this, it is preferable that the lower gas guide tube 46 is supplied with gas, while gas is exhausted by means of the upper gas guide tube 44. The lower gas guide tube 44 allows a good distribution of gas below the wafer boat and the removal at the upper gas guide tube 46 allows the gas between the plates 6 of the wafer boat 1 to be moved upwards.

In order to enhance this effect, that is, to direct the gas flow in particular between the plates 6 of the wafer boat, there are two optional, moveable deflection elements 50 provided in the process chamber. The deflection elements 50, which are not shown in FIG. 4, for reasons of simplification of the representation, have an elongated configuration. The deflection elements 50 extend in a longitudinal direction of the process tube 36 and are preferably at least as long as the wafer boat. Preferably the deflection elements 50 should be at least as long as the length of the region of the lower gas guide tube 44 in which the openings 48 are situated. The deflection elements 50 are situated below the wafer boat and in a transverse direction lateral to the wafer boat 1 in the process chamber 38. At their upper end, the deflection elements 50 are each pivotally supported and can be moved by means of an adjustment mechanism (not shown) between a first position, which is shown in FIGS. 5 and 7-9 with a solid line, and a second position, which is shown in FIGS. 5 and 7-9 with a dashed line. In the first position, the deflection elements basically prevent a gas flow around the sides of the wafer boat, while such a gas flow is allowed in the second position.

The adjustment mechanism can e.g. be a mechanism which reacts to pressure in the process chamber 38, which e.g. moves the deflection elements 50 automatically to the first position in the case of a certain negative pressure in the process chamber 38. Other adjustment or actuating mechanisms are however conceivable, which are operated mechanically or electrically, although suitable supply lines for controlling them must be provided.

Figure 7:
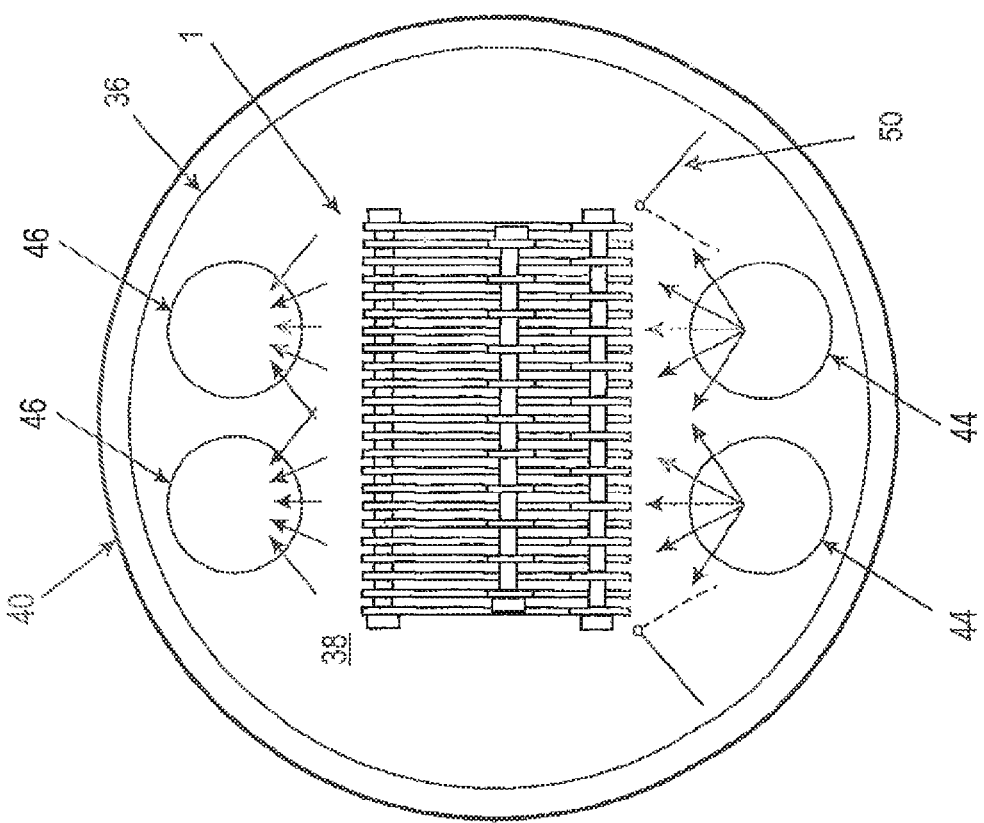
FIG. 7 shows a schematic front view of an alternative process chamber of the plasma treatment apparatus according to FIG. 4.
Figure 9:
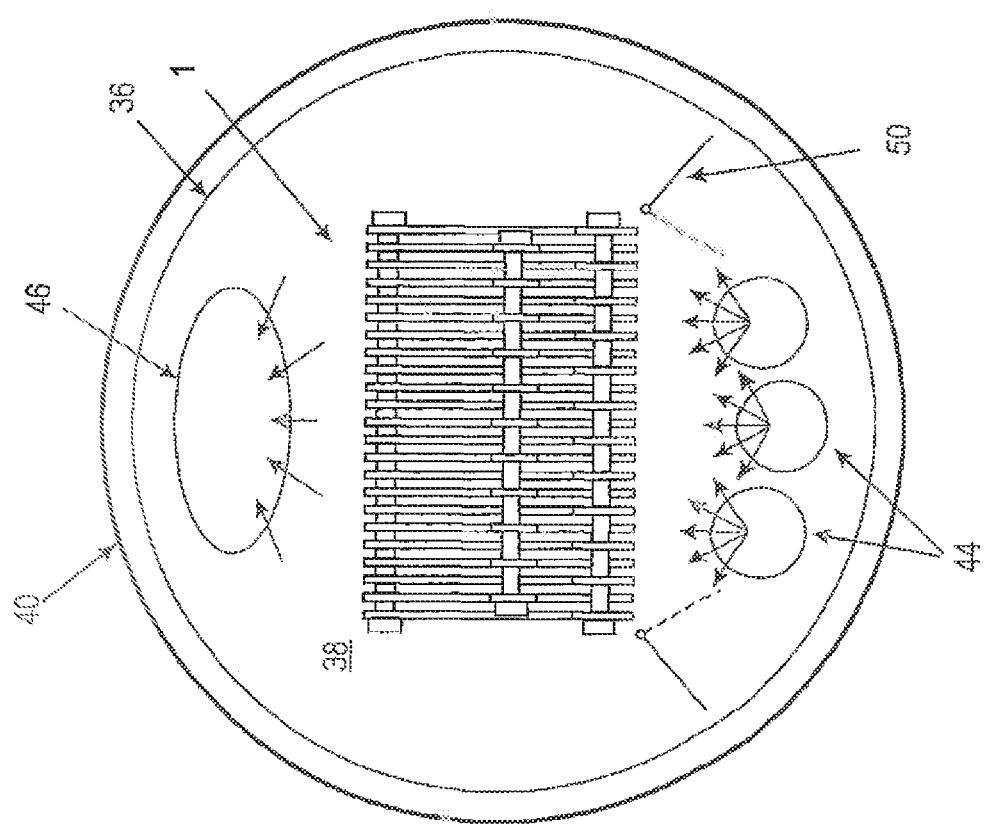
FIG. 9 shows a schematic front view of a further alternative process chamber of the plasma treatment apparatus according to FIG. 4.

FIGS. 7-9 show schematic front views of alternative process chamber constructions, which differ solely in respect of the form and/or number of gas guide tubes. In the embodiment according to FIG. 7, two lower and two upper gas guide tubes are provided. The lower gas guide tubes 44, 44 are situated in a horizontal plane below the wafer boat 1 and are symmetrically positioned with regard to a vertical centre plane of the process chamber. With regard to the openings, they can be constructed and arranged in the same way as the above described gas guide tube. The upper gas guide tubes 46, 46 are situated on a horizontal plane above the wafer boat 1, and they are also symmetrically positioned with regard to the vertical centre plane of the process chamber. In particular in the case of this construction or a similar construction having several lower gas guide tubes for supplying gas, different gases can be fed into the process chamber 38 via different gas guide tubes, so that the gases are not mixed until they are in the process chamber, in order to avoid a premature reaction within the gas supply.

However in the embodiment according to FIG. 8, only one lower and one upper gas guide tube 44, 46 is provided. The gas guide tubes 44, 46 each have an elliptical cross-sectional shape, wherein the main axes are horizontally positioned. Again, the gas guide tubes 44, 46 are situated centrally below and above the wafer boat 1, respectively. In other words, they are situated symmetrically with respect to a vertical centre plane of the process chamber. With regard to the openings, they can be constructed and arranged in the same way as the above described gas guide tube.

In the case of the embodiment according to FIG. 9, three lower gas guide tubes 44 and one single upper gas guide tube 46 are provided. The lower gas guide tubes 44 are situated below the wafer boat 1, wherein the two outer ones are at one level and the middle one is at a slightly lower level. However, another arrangement would be possible. With regard to the openings, they can be constructed and arranged in the same way as the above described gas guide tube. The upper gas guide tube 46 is situated above the wafer boat 1 and has an elliptical cross-sectional shape, as in FIG. 8, and it is situated symmetrically with respect to a vertical centre plane of the process chamber. Alternatively, several gas guide tubes or another shape of the gas guide tube could be used here. In particular in the case of this construction or a similar construction having several lower gas guide tubes for supplying the gas, different gases can be fed into the process chamber 38 through different gas guide tubes, so that the gases are not mixed until they are in the process chamber, in order to avoid a premature reaction within the gas supply. In particular, in the case of this arrangement, a first gas can be fed in by means of the outer gas guide tubes 44, while a second gas is fed in by means of the middle gas guide tube. The arrangement allows a good and homogeneous mixing and distribution of the gases.

Now the control section 34 of the treatment apparatus 30 will be described in more detail. The control section 34 has a gas control unit 60, a negative pressure control unit 62, an electrical control unit 64 and a temperature control unit (not shown in more detail), which can all together be controlled by means of a high-level controller, such as a processor. The temperature control unit is connected to the heating unit (not shown) in order primarily to control or regulate the temperature of the tube element 36 or the process chamber 38.

The gas control unit 60 is connected with a plurality of different gas sources 66, 67, 68 such as for example gas canisters containing different gases. In the depicted form, three gas sources are shown, although of course any other number of gas sources can be provided. For example, the gas sources can provide at the respective openings of the gas control unit 60 di-chlorosilane, tri-chlorosilane, $SiH_4$, phosphine, borane, di-borane, germane ($GeH_4$), Ar, $H_2$, TMA, $NH_3$, $N_2$ and other different gases. The gas control unit 60 has two outlets, one of which is connected with the lower gas guide tube 44, and the other of which is connected with a pump 70 of the negative pressure control unit 62. The gas control unit 60 can connect the gas sources in a suitable manner with the outlets and can control the flow of gas, as is well known in this field of technology. In this way, the gas control unit 60 can direct different gases into the process chamber in particular by means of the lower gas guide tube 44, as will be described hereafter.

The negative pressure control unit 62 basically comprises the pump and a pressure control valve 72. The pump 70 is connected via the pressure control valve 72 with the upper gas guide tube 46 and can by means of this pump the process chamber to a pre-determined pressure. The connection from the gas control unit 60 to the pump also serves to dilute process gas which is pumped out of the process chamber if necessary with $N_2$.

The electrical control unit 64 comprises at least one voltage source which is suitable for providing at one output thereof at least one of the following: a DC voltage, a low-frequency voltage and a high-frequency voltage. The output of the electrical control unit 64 is connected with a cable to a contact unit for the wafer boat in the process chamber. The cable is inserted by means of a suitable vacuum- and temperature resistant passage way through the jacket 40 and into the tube element 36. The cable is built in such a way that it is in the form of a coaxial cable 74 with an inner conductor and an outer conductor. Along the length of the coaxial cable 72 there is at the outside approximately zero electromagnetic field, so that, even in the case of high frequencies in the MHz range, no parasitic plasmas are generated and that the transmission is lossless as far as possible. In the interior of the coaxial cable there is a wave propagation with wavelength $\lambda$. The wave propagation proceeds between pairs of plates (planar waveguide), although with another wavelength, which is dependent on the presence and type of plasma. Between the guides there is a suitable dielectric, which, when supplied with a high-frequency voltage, lowers the propagation speed and the wavelength of the electromagnetic wave in the coaxial cable as opposed to a corresponding propagation speed and wavelength of the electromagnetic wave in the vacuum. The lowering of the propagation speed and wavelength of the electromagnetic wave in the coaxial cable as opposed to a corresponding propagation speed and wave length of the electromagnetic wave in the vacuum is equivalent to an increase of the effective electrical length of the coaxial cable 74 with respect to the wavelength in a vacuum. In particular in the case of a impedance transformation owing to the low impedance of the wafer boat 1, the geometrical length of the coaxial cable should be near to an odd-numbered multiple of $\lambda/4$ of the wavelength which was reduced by the dielectric, or, in other words, the effective electrical length of the coaxial cable should be set at approximately an odd-numbered multiple of $\lambda/4$ of the wavelength of the supplied frequency.

In one embodiment, an adjustment of the wavelength or electrical length of the coaxial cable 74 is achieved by means of a plurality of insulators which can be introduced into the gap between the interior conductor and the exterior conductor and thus form the dielectric. A certain degree of adjustment can also be achieved by means of the geometry of the interior conductor and the exterior conductor. Although the interior conductor and the exterior conductor of the coaxial cables usually have a round cross section, the term coaxial cable, as used in the present application, should also include interior and exterior conductors with other cross sections. For example, the interior conductor and/or the exterior conductor can have rectangular or oval cross sections and extend along a common longitudinal axis. The local propagation speed of the high-frequency wave, and altogether therewith the effective electrical length of the coaxial cable 74, is substantially dependent on the dielectric between the interior conductor and the exterior conductor. With an increasing dielectric constant, the propagation speed declines at a rate of $1/(\varepsilon_r)^{1/2}$ and, accordingly, the effective electrical length of the coaxial cable 74 rises at the same rate. By means of a suitable serial layout of short insulator pieces of differing dielectric constant along the length, a desired medium dielectric constant can be achieved. The insulator pieces can have a shape which is suitable for the interior and exterior conductors, such as e.g. a ring shape, which allows sliding them along the interior conductor. The coaxial cable 74 extends substantially to the contact sections of the wafer boat 1. The interior conductor and the exterior conductor are contacted in a suitable manner with the different groups of plates 6.

The wave propagation between the plate pairs influences the characteristics of the generated plasmas, for example in the homogeneity/uniformity above the wafers and the wafer boat.

To this end, the contact projections 13 of the wafer boat 1 should be reduced as much as possible in mass and length for introducing high-frequency power, in order to keep the local heat capacity and the inductance of the supply path as low as possible. In particular, the inductance of the supply path formed by the sum of the contact projections 13 in combination with the contact elements 15 should be substantially smaller than the inductance of the sum of the plates 6. Preferably, the inductance of the corresponding inductance of the supply path at operating frequency should be less than half and preferably less than $\frac{1}{10}$ of the inductance of the plate stack of plates 6.

Figure 12:
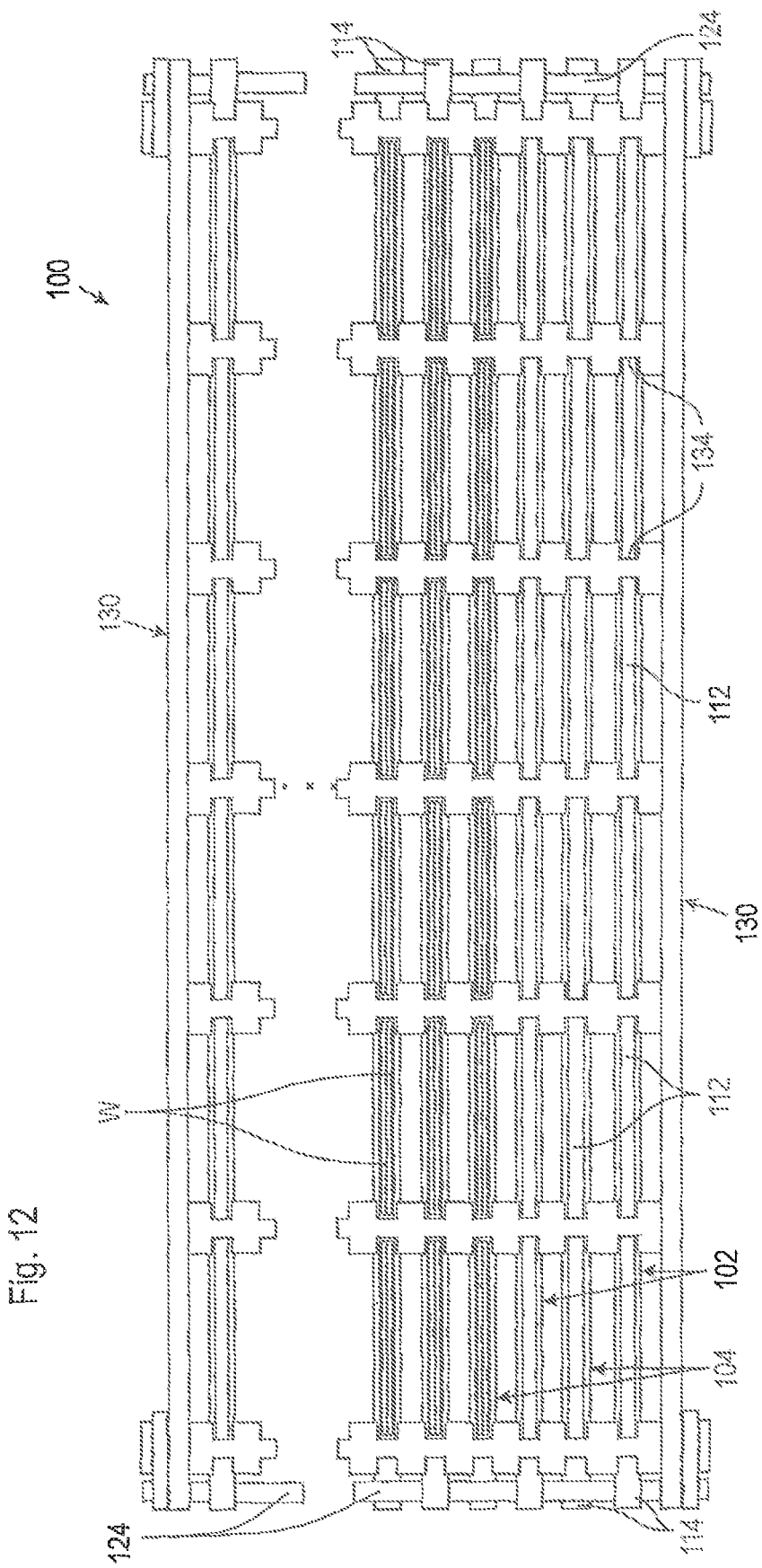
FIG. 12 shows a schematic top view onto a section of the wafer boat according to FIG. 9.

The FIGS. 10-12 show an alternative wafer boat 100 which can be used in a plasma treatment apparatus 30 of the above-described type but can also be used in classical plasma treatment apparatuses. The wafer boat 100 comprises an electrically conductive support assembly 101 with a plurality of electrically conductive supports 102, 104, made e.g. of graphite or another electrically highly conductive material, and an insulated guide unit 106. The support assembly 101 and the insulated guide unit 106 are connected by means of insulated connection elements 108 and together form the wafer boat 100.

The electrically conductive supports 102, 104 can best be seen in the schematic side views of FIGS. 11*a* to 11*c*. FIG. 11*a* shows a schematic side view of the support 102, FIG. 11*b* shows a schematic side view of the support 104, and FIG. 11*c* shows a schematic side view of supports 102, 104 in a final position.

The supports 102, 104 each have an elongated basic body 110 which has a substantially rectangular profile. The basic body 110 has in each case a straight middle part, in the top side of which there is a slit 112 for the reception of wafers (W). In the longitudinal direction, the slit 112 is sized in such a way that it can receive six wafers (W) next to one another at predetermined intervals, as can be seen in FIG. 10. The depth of the slit is selected so that it is smaller than or equal to a normal edge waste area formed in the wafer manufacture, and is generally approximately 1-5 mm. The width of the slit is in turn selected to allow two wafers requiring treatment (W) to be inserted back-to-back, as is indicated in the top view according to FIG. 12. The slit 112 can be inclined transversely at 1°-2° in relation to the longitudinal direction, so that a wafer pair inserted therein stands slightly tilted in the slit 112. At their longitudinal ends (adjacent to the middle section 111 which features the slit 112) each of the basic bodies 110 has end sections 114 which are offset in relation to the middle section 111 to a level upwards or downwards. The end sections 114 of the support 102 are offset upwards, and the end sections 114 of the support 104 are offset downwards, as can easily be seen in FIGS. 11*a* and 11*b*. When the supports 102, 104 are in the end position, the end sections 114 of the supports 102 lie on an upper level and the end sections 114 of the supports 104 lie on a lower level, as can be seen in FIG. 11*c*.

In the basic bodies 110 there is in each case a plurality of cross-bores 116 which serve for the insertion of clamp elements 118 and 120. These can be of the type described above with a head and shaft section, which can cooperate with counter elements. The clamp elements 118 are used in the middle section 111, whereas the clamp elements 120 are used in the region of the end sections 114.

In their end position there is a plurality of the supports 102, 104 (e.g. 22) positioned parallel to one another transversely to their longitudinal direction, wherein the supports 102 and 104 alternate in the layout. In the middle section 111 of the supports 102, 104, spacers (not shown) are provided between directly adjacent supports 102, 104 which are lined up with the cross-bores 116. These spacers are sleeve-shaped and dimensioned such that they are put onto the shaft section of the clamp element 118 in an assembled condition of the wafer boat 100. The spacers can be electrically isolating or electrically conductive, as are the above described spacer elements 22 of the wafer boat 1, inasmuch as they should perform a similar heating function.

In the region of the end sections 114 are provided in each case electrically conductive sleeves 124 which are so dimensioned as to be able to be put onto the shaft section of one of the clamp elements 120. The length of each of the sleeves 124 is the length of two spacers plus the width of a support. In this way they can each electrically connect two supports 102, 102 or 104, 104 in the arrangement. In this way, the supports 102 form a first group of supports which are all electrically connected with each other, and the supports 104 form a second group of supports which are all electrically connected with each other. This in turn allows to apply a voltage to the different groups, as also in the case of wafer boat 1.

The guide unit 106 comprises two elongated holding elements 130 and seven guiding rods 132, which are all made of a dielectric material. The holding elements 130 and the guiding rods 132 can e.g. be made of ceramic or quartz. The holding elements 130 each have an elongated configuration and have the same length substantially as the length of supports 102, 104, and they extend substantially parallel to supports 102, 104, wherein the holding elements 130 are positioned higher than the supports 102, 104. The guiding rods 132 extend perpendicularly between the holding elements 130, as can be seen in the top view according to FIG. 12, and they are connected in a suitable manner with them. The guiding rods 132 can have a circular cross section, although other shapes are also possible. The guiding rods 132 each have a plurality of notches 134 which are dimensioned so that they can receive and guide an edge area of wafer pairs W, W, in particular a edge waste area. In a longitudinal direction of the wafer boat 100 the guiding rods 132 are spaced in such a way that they can each receive a wafer pair W, W between them, as is indicated in FIG. 12. At this point it should be noted that the top view according to FIG. 12 does not show the wafer boat 100 completely, and that the wafer boat is only partially loaded, for reasons of simplifying the picture. The notches 134 are lined up with the slits 112 in the supports 102, 104 in a transverse direction of the wafer boat 100. Inasmuch as the slits 112 have an inclination, the notches 134 are correspondingly slightly offset with respect to the slits 112, in order to allow to hold the wafer pairs W, W in a slightly inclined position.

The support unit 101, consisting of the connected supports 102, 104, and the insulated guide unit 106, consisting of the support elements 130 and guide rods 132, are each connected in the end sections by means of insulated connecting elements 108. In particular, the connecting elements 108 have a plate shape and they cooperate with the clamp elements 118 and 120 and further clamp elements for the connection with holding element 130, in order to fix the entire arrangement and form the wafer boat 100.

The wafer boat 100 can be used in the same way as a classical wafer boat or also in the form described hereafter, when the spacers are electrically conductive, such as the spacers 22 in the case of wafer boat 1. Electrical connection with the wafer pairs W, W which are situated on the supports 102, 104 takes place only in the region of the respective slits 112. The wafer boat 100 does not take up the wafers between plates, but leaves them substantially free-standing. This allows an improved heating of the wafers. This is additionally promoted by means of a reduced thermal mass of the wafer boat 100 in comparison with wafer boat 1. The back-to-back arrangement of the wafer pairs can contribute to improved lack of slippage of processed wafers. In addition, where appropriate, the lateral dimensions of the wafer boat can be decreased while maintaining the same capacity.

With the help of FIGS. 13 and 14, a further alternative embodiment of a wafer boat 200 will be described in more detail, which can be used in a plasma treatment apparatus 30 of the above-described type but also in classical plasma treatment apparatuses. FIG. 13 shows a schematic side view of a loaded wafer boat, and FIG. 14 shows a schematic side view of a single plate of the wafer boat. Generally, the wafer boat 200 is formed by electrically conductive plates 202, 204, which are made e.g. of graphite or another electrically highly conductive material, which are positioned alternatingly parallel to one another using spacers and clamp elements 206 which are not shown in more detail. This can be achieved in the manner described above, wherein the spacers can be made of a dielectric material or a high-resistance electrically conductive material, depending on whether they should perform an additional heating function or not, as will be described in more detail hereafter.

The plates 202, 204 each have recesses 208 which are open to the top. On both sides of the plates 202, 204 there is provided in the region of every recess a group of three carrier rods 210 which provide a three point support for the wafers to be supported. In each case, one of the carrier rods is below the recess 208 and two are on opposite sides of the recess 208 and higher than the lower carrier rod 210. The height difference between the lower carrier rod 210 and the upper edge of the plates 202, 204 is less than half the height of a wafer to be supported. Unlike in the case of wafer boat 1, the inserted wafers are not taken up entirely between two plates, but protrude clearly above the plates, as can be seen in FIG. 13. In comparison with wafer boat 1, wafer boat 200 has a substantially reduced thermal mass.

The plates 202, 204 each have at their ends contact projections 213, wherein the contact projections 213 of both plates in turn are located at different heights, in order to facilitate a group-wise contact of the plates by means of electrically conductive contact elements (not shown). The contact projections are preferably kept short and are rounded to the outside, but can also be of another shape. In addition, the height distance between the contact projections is shortened, which is of advantage when supplying them with a high-frequency voltage, in particular in MHz range, in particular when a coaxial supply is provided, as in the above-described plasma treatment apparatus 30.

Figure 15:
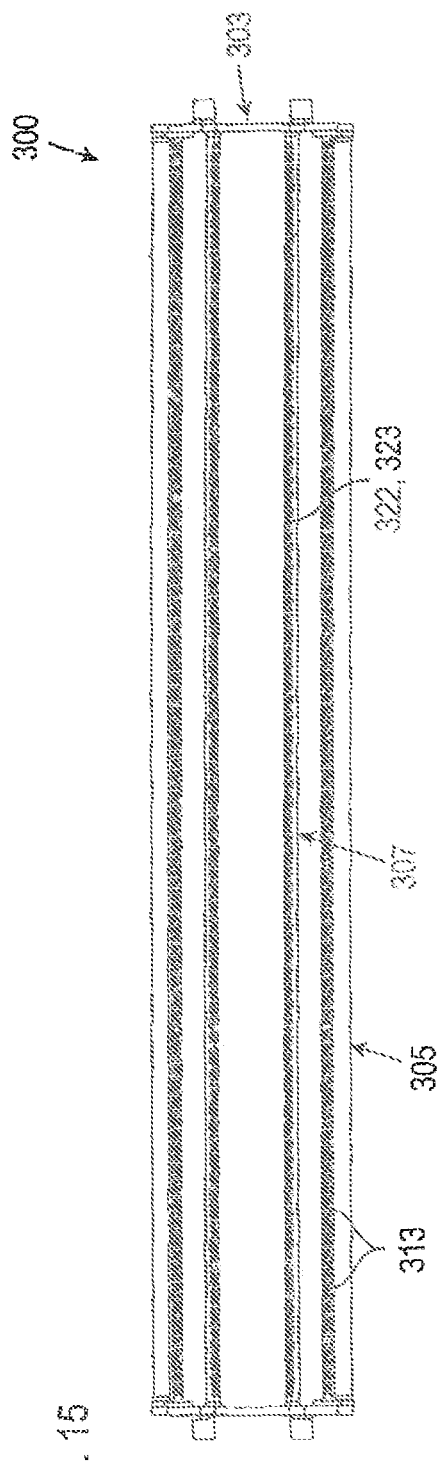
FIG. 15 shows a schematic top view onto a further alternative wafer boat.
Figure 16:
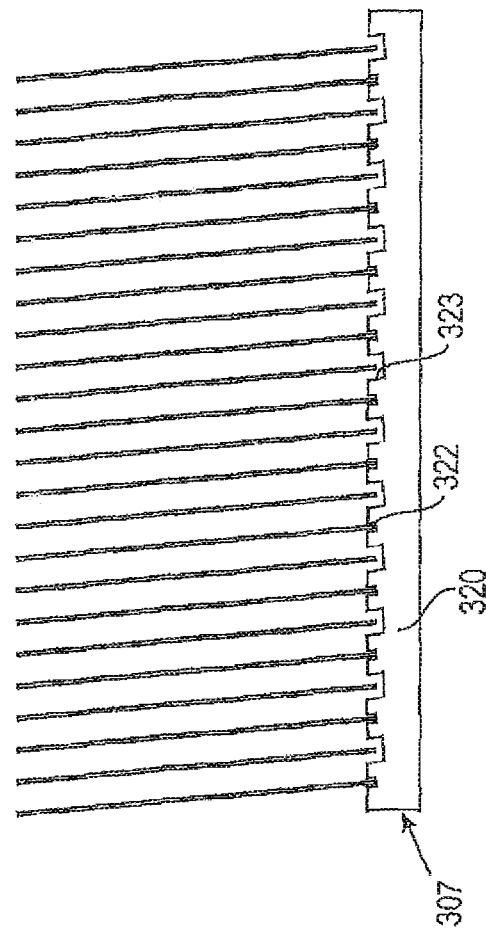
FIG. 16 shows a schematic side view of a part of the wafer boat according to FIG. 15.

With the help or FIGS. 15 and 16, a further alternative embodiment of a wafer boat 300 will be described in more detail, which can be used in a plasma treatment apparatus 30 of the above-described type but also in classical plasma treatment apparatuses. FIG. 15 shows a schematic top view onto the wafer boat 300, FIG. 16 shows a schematic sectional view of a partial area of the wafer boat 300 and FIGS. 17(*a*) and (*b*) show schematic sectional views of a plasma treatment apparatus with a wafer boat 300. While the previously discussed wafer boats were each of the type in which the wafers are inserted parallel to the longitudinal extension of the wafer boat (and parallel to the longitudinal extension of the plasma treatment apparatus), wafer boat 300 is of the type in which the wafers are inserted transversely to the longitudinal extension of the wafer boat 300. In particular wafer boat 300 is of a classical construction such as is used in thermal diffusion systems for semiconductor wafers.

As can be seen in the top view according to FIG. 15, the wafer boat 300 has an elongated configuration; in other words, it is longitudinal (left-to-right in FIG. 15) substantially longer than in the other dimensions. At each end of the wafer boat 300 is provided an end plate 303 which is preferably made of quartz. It can however be made of another non-conductive material. Between the end plates 303 extend two carrier elements 305, which are spaced crosswise, and two spaced contact/guide elements 307 which are in each case attached to the end plates 303. The contact/guide elements 307 are situated crosswise between the carrier elements 305.

The carrier elements 305 extend, as previously mentioned, between the end plates 303 and are attached to them, in particular by welding or bonding. The carrier elements 305 can also be made of quartz and are of an elongated rod shape. The carrier elements 305 have a substantially rectangular profile, although "substantially" should also include rectangles with rounded corners. It would also however be generally possible for the carrier elements 305 to be round or of other shapes in profile. The substantially rectangular carrier elements 305 are positioned inclined towards one another, and each have on their narrow side pointing upwards a plurality of carrier slits 313, which extend crosswise to the longitudinal extension of the carrier element 305 and preferably substantially at an angle of 90° to the longitudinal extension. The carrier slits 313 are in each case positioned at the same distance from one another and they have a pre-determined (constant) depth for receiving therein an edge section of each wafer or wafer pair which is to be inserted, wherein the wafer pair can e.g. be inserted in a back-to-back arrangement in the slit. The depth should preferably be the same as the edge waste area of the wafer, or smaller. The carrier slits can be inclined in a longitudinal direction by 1° or 2°, so that a wafer or wafer pair which is inserted is positioned accordingly inclined to the vertical.

In the following, the contact/guide elements 307 will be described in more detail, wherein two of these elements are shown in the top view according to FIG. 15. The contact/guide elements 207 comprise substantially a rod-shaped element 320 made of an electrically conductive material such as e.g. graphite, the ends of which are electrically contactable in a suitable way, which is not shown here.

Figure 17:
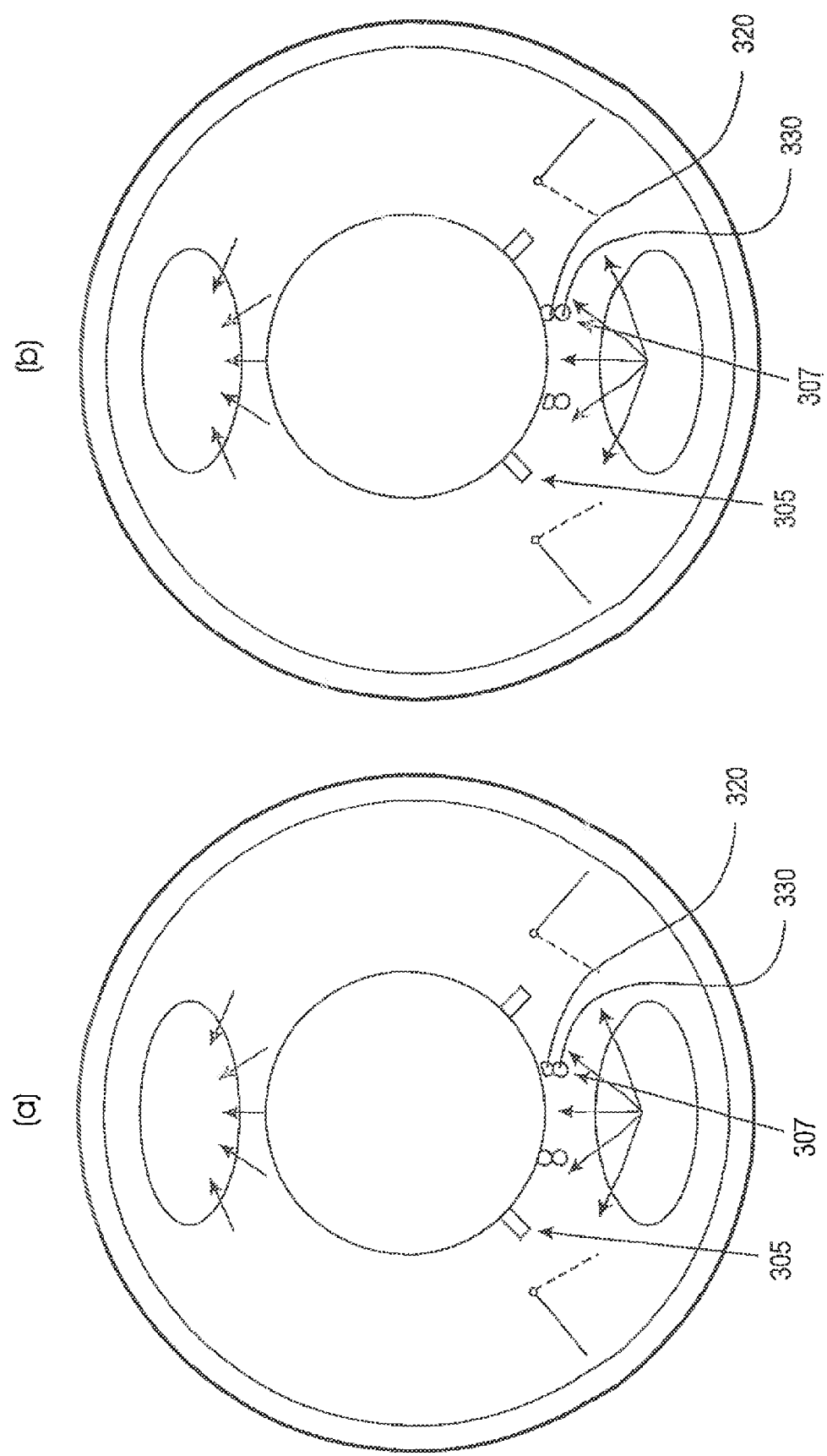
FIGS. 17($a$) and ($b$) show schematic cross-sectional views through a process chamber of a plasma treatment apparatus according to FIG. 4 with a wafer boat according to FIG. 15 received therein.

The rod-shaped elements 320 each have a substantially round cross section, as can best be seen in the sectional view according to FIG. 17. In each rod-shaped element 320 is provided a plurality of slits 322 (contact slit) and slits 323 (isolating slit), which alternate in a longitudinal direction, as can best be seen in FIG. 16. The slits 322 each have a first depth and a first width, and slits 323 have a second depth and a second width, wherein the second depth is larger than the first, and the second width is larger than the first, as will be described in more detail hereafter. The slits 322, 323 are spaced identically to the slits 313 of the carrier elements 303, which means here the respective distance from the slit middle of each slit to the slit middle of the next slit. The slits 322, 323 in the spaced contact/guide elements 307 are offset from one another. In addition, the slits 313, 322 and 323 are positioned together in such a way that a wafer (or a wafer pair) inserted into the wafer boat is in each case inserted into two slits 313 (the spaced carrier elements), one slit 322 (of a contact/guide element 307), and one slit 323 (of the other contact/guide element 307). The depth and width of the slit 322 is selected so as to allow the wafer (or wafer pair) to contact the contact/guide element 307 reliably. The depth and width of the slit 323 is selected so as to make sure that the wafer (or wafer pair) definitely does not come into contact with the contact/guide element 307, as is indicated in FIG. 16.

Hereby it is ensured that adjacent wafers (wafer pairs), which are inserted into slits in the wafer boat which are longitudinal adjacent, contact different contact/guide elements. This is e.g. indicated in FIGS. 17(a) and (b) which e.g. show cross-sectional views through adjacent slits in the wafer boat. The cross section in the view according to FIG. 17(a) is located such that it intersects a slit 322 in the left contact/guide element 307 and a slit 323 in the right contact/guide element 307. Accordingly, in the case of the adjacent slit (view FIG. 17(b)), a slit 323 is intersected in the left contact/guide element 307 and a slit 322 is intersected in the right contact/guide element 307. The skilled person will recognise that a voltage can be applied between the wafers when a voltage is applied between the contact/guide elements 307. Although it is not shown in FIG. 16, isolating inlays can be set into each slit 323 which themselves have corresponding slits for the wafer (wafer pair), or the slits 323 can have an insulating coating. In particular, it is possible to form the slits 323 first in the contact/guide element 307, and then to apply an insulating coating, which is then locally destroyed when the slit 322 is formed in the following. In this way the electrical contact with the wafers is possible only in the region of the slits 322. The electrical contacting can be achieved by means of suitable contact units which contact the contact/guide elements 307.

The contact/guide elements 307 can be quite thinly constructed. However, in order to ensure a sufficient stability throughout the entire length of the wafer boat, there is a second rod-shaped element 330 provided in the shown embodiment of the wafer boat 300, which is positioned vertically below the contact/guide elements 307 and extends between the end plates 303. The element 330 is preferably made of an electrically insulating material with sufficient stability to prevent contaminants from entering the process and with a sufficient thermal stability, such as e.g. quartz or another suitable material. The contact/guide element 307 can be disposed directly onto element 330, as shown, or there can be a plurality of supports provided between the lower element 330 and the contact/guide element 307. The lower element 330 can in its turn have a round form, but does not have a slit and has for this reason a higher stability than a similar element with slits, and it can for this reason support the contact/guide element 307 over its entire length.

Figure 18:
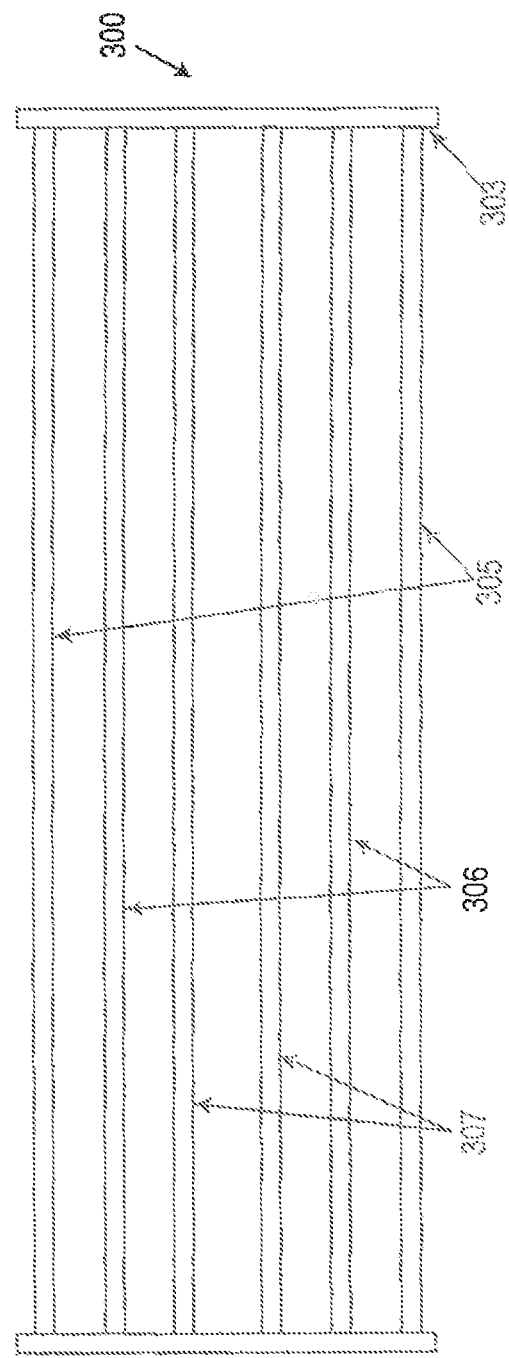
FIG. 18 shows a schematic top view of a further wafer boat.
Figure 19:
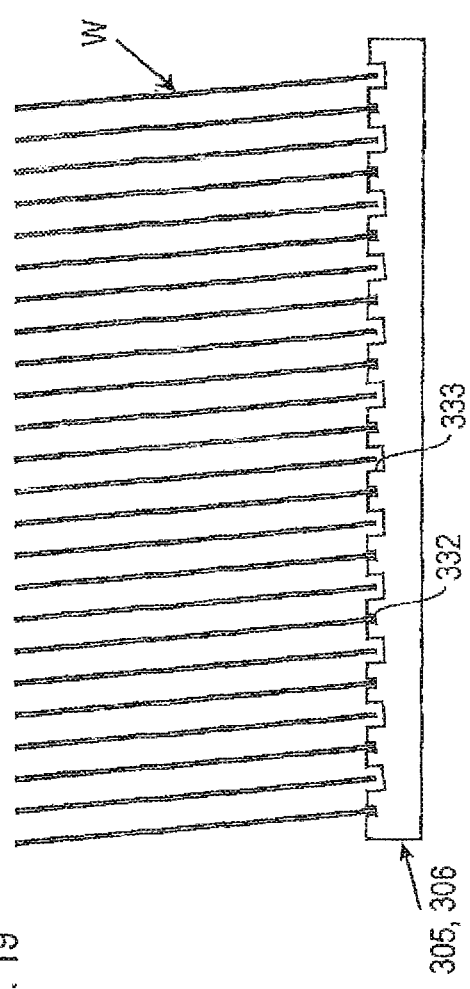
FIG. 19 shows a schematic side view of a portion of the wafer boat according to FIG. 19.

FIGS. 18-20 show a further alternative embodiment of a wafer boat 300. This wafer boat 300 is for the main part identical to the wafer boat 300 described in FIGS. 15-17, and for this reason the same reference signs are used for identical or similar elements. FIG. 18 shows a schematic top view onto the wafer boat 300, and FIG. 19 shows a schematic cross-section of a partial area of the wafer boat 300, and FIGS. 20(a) and (b) show schematic cross-sectional views of a plasma treatment apparatus with such a wafer boat 300. Also in the case of this wafer boat, the wafers are introduced transversely to the longitudinal extension of the wafer boat 300.

As can be seen in the top view according to FIG. 18, the wafer boat 300 has in turn an elongated configuration, wherein an end plate 303 is provided at each end of the wafer boat 300, which can be formed as previously described. Between the end plates 303 extend in each case two first carrier elements 305 spaced crosswise, two second carrier elements 307 spaced crosswise, and two spaced contact/guide elements 307 which are in each case attached to the end plate 303. Herein the contact/guide elements 307 are situated crosswise between the second carrier elements 306, and the second carrier elements 306 are situated in each case between one first carrier element 305 and one contact/guide element 307.

The contact/guide elements 307 have the same construction as previously described, with upper and lower rod elements 320, 330 and contact slits 222 and isolating slits 223, which are positioned offset from one another in the respective contact/guide elements 307. This means that every second wafer inserted into the wafer boat will be contacted by one of the contact/guide elements 307, while the other wafers will be contacted by the other contact/guide element.

The first and second carrier elements 305, 306 extend between the end plates 303 and are attached to these plates as described above. The first and second carrier elements 305, 306 can also be made of quartz and are both of elongated rod-shape. The first and second carrier elements 305, 306 both have a basic shape, such as can be seen in the case of wafer boat 300 in FIGS. 15-17. Each of them also has a plurality of slits 330 corresponding to the plurality of carrier slits 313 according to FIG. 15-17. The slits 330 are in the form of two types of slit, which differ with respect to their size and function.

The first type of slit, which serves as carrier slit 332, has a first depth and a first width which are suitable for receiving in the slit in a contacting manner the edge area of an inserted wafer or wafer pair, for example in a back-to-back manner. Preferably, the depth of the slit is approximately equal to or smaller than the edge waste area of the wafer. The second type of slit, which serves as an isolating slit 333, has a second depth and a second width which are in each case greater than the first depth and first width. The isolating slits 333 are in each case suitable for receiving an edge area of an inserted wafer or wafer pair standing freely, in other words, without contact.

The carrier slits 332 and the isolating slits 333 alternate along the longitudinal direction of the carrier elements 305, 306, as can be seen in the view in FIG. 19. The carrier slits 332 and the isolating slits 333 of the first carrier elements 305 are aligned to one another. Also, the carrier slits 332 and the isolating slits 333 of the second carrier elements 306 are aligned to one another. In addition, the carrier slits 332 of the first carrier elements 305 are aligned to the isolating slits 333 of the second carrier elements 306, and the isolating slits 333 of the first carrier elements 305 are aligned to the carrier slits 332 of the second carrier elements 306. In other words, the carrier slits and isolating slits 332, 333 of the first carrier elements 305 are offset from the carrier slits and isolating slits 332, 333 of the second carrier elements 306.

In this way, every second wafer inserted into the wafer boat is inserted into and supported by the first carrier elements 305, while the other wafers are inserted into and supported by the second carrier elements 306. Hereby it is also achieved that all wafers which are inserted into and supported by the first carrier elements 305 contact the same contact/guide element 307, while the other wafers which are inserted into and supported by the second carrier elements 306 contact the other contact/guide element 307. A respective alternating supporting and contacting is indicated in FIGS. 20(*a*) and (*b*). During operation, this configuration can prevent a short circuit between adjacent wafers by means of the first and second carrier elements 305, 306 in the case that during a plasma treatment (having for example the purpose of depositing conductive coatings onto the wafers) conductive coatings are deposited onto the first and second carrier elements 305, 306.

In this configuration it would also be possible to provide conductive first and second carrier elements 305, 306 and additionally to apply a voltage between the wafers inserted into the wafer boat 300, in order to increase the contact surface to the wafers and the surface for the transmission of electrical power.

Hereafter the operation of the plasma treatment apparatus 30 will be described in more detail with reference to the drawings, wherein a plasma-supported deposition of silicon nitride or aluminium oxide in a plasma induced by 13.56 MHz is used as an example of a plasma treatment. The treatment apparatus 30 can however also be used for other deposition processes which are also plasma-supported, wherein the plasma can also be induced by other frequencies, e.g. those in the range of 40 kHz. The coaxial cable 74 is, however, particularly suitable for frequencies in the MHz range and optimised for these.

First, it will be assumed that a loaded wafer boat 1 of the type described above (according to FIG. 1) is inserted into the process chamber 38, and that the chamber is closed by means of the shutting mechanism (not shown). Herein, the wafer boat 1 is loaded in such a manner that in each carrier slit 11 there are in total 12 wafers, in the present example in particular silicon wafers; particularly six wafers at each plate 6. The wafers are inserted in such a way that they face each other in pairs, as is well known in this field of technology.

In this condition, the interior chamber is at ambient pressure and can e.g. be purged or flooded with $N_2$ by the gas control unit 60 (in combination with the negative pressure control unit 62).

The tube element 36 and therewith the process chamber 38 are heated up by the not shown heating device, in order to warm up the wafer boat 1, and the wafers inserted into it, to a pre-determined temperature which is advantageous for the process. The deflection elements are in the second position (shown in dashed lines in FIG. 5) in order not to affect heating by means of convection. Nevertheless, heating the inboard plates of the wafer boat 1 and the wafers situated between the plates can take a long time using a heating of the tube element 36.

For this reason, when a wafer boat 1 of the type described above is provided, a DC voltage or a low-frequency AC voltage can be applied by the electrical control unit 64 to the wafer boat 1 to support the heating process. The voltage is in this case sufficiently high to allow electrical current to be conducted through the high-resistance spacer elements 22 and to allow these to function as resistance heating elements. In this way, heating power is provided specifically in the carrier slits 11, so that the pre-determined temperature can be reached much quicker than would be the case with heating from outside. Depending on the resistance of the spacer elements, voltages of at least 200 V to approximately 1 kV are considered, in order to achieve a sufficient flow of electrical current and a sufficient heating of the spacer elements 22.

When the pre-determined temperature of the wafer boat 1 and therewith the entire unit (wafer boat 1, wafers and tube element 36) has been achieved, the electrical control unit 64 can first be deactivated, and the process chamber is pumped to a pre-determined negative pressure by the negative pressure control unit 62. The deflection elements 50 are automatically moved into the first position (solid line in FIG. 5) by the negative pressure being set, or are actively moved into the first position. When the pre-determined negative pressure has been reached, a desired process gas, such as e.g. $SiH_4/NH_3$ for a silicon nitride deposition, in defined proportions, dependent on the desired coating properties, is let in by means of the gas control unit 60, while the negative pressure is maintained by the negative pressure control unit 62 by pumping out the introduced process gas. The process gas pumped out by the pump 70 can be diluted with $N_2$ at this point in time, as is well known in this field of technology. For this purpose, $N_2$ is added by means of the gas control unit 60 and the appropriate tube from the pump. By means of the special arrangement of the gas tubes 44, 46 in combination with the deflection elements 50, a gas flow within the process chamber is primarily generated through the carrier slit 11 of the wafer boat 1. This can be ensured to be homogeneous throughout the width and length of the wafer boat by means of the special arrangement of the gas tubes 44, 46.

By means of the electrical control unit 64, a high-frequency voltage with a frequency of 13.56 MHz is applied to the wafer boat 1. This results in a plasma ignition of the process gas between the plates 6 and in particular between the wafers inserted in wafer boat 1 and results in a plasma-supported silicon nitride deposition onto the wafers. The gas flow is kept constant during the deposition process, in order to avoid a local depletion of the active components of the process gas. When the time required for deposition of the requisite thickness of coating has elapsed, the electrical control unit is again deactivated, and the gas supply is stopped, or switched back to supplying $N_2$ in order to purge the process chamber 38 and if necessary to ventilate it (returning it to atmospheric pressure). Finally, the process chamber 38 can then be brought back to environmental pressure.

As can be seen from the above description, the wafer boat 1 of the above type—independently of the other components of the treatment apparatus—offers the advantage of allowing, during the heating phase, to heat up directly in the region of the carrier slits 11 between the plates 6 of the wafer boat 1. This is possible by means of the electrically conductive spacer elements 22. Since they have been specifically selected for being highly resistant, they do not significantly affect the plasma generation when a high-frequency voltage is applied.

The specific gas supply by means of the gas supplies 44, 46 offers the advantage—again independently of the other components of the treatment apparatus, including the special wafer boat 1—of a homogeneous gas flow in the process chamber 38. In particular in combination with the deflection elements, a targeted gas flow through the carrier slits can be achieved. This guarantees a good gas exchange and a homogeneous gas distribution in the reaction chamber and, where applicable, lower flow rates can be used for the process gases.

The specific coaxial cable 74 allows the advantage—again independently of the other components of the treatment apparatus, including the special wafer boat 1 with electrically conductive spacer elements 22 or the special gas supply—that voltages in the MHz range (and particularly of 13.56 MHz) can be efficiently applied to the wafer boat. Electrical losses can be reduced. This is enhanced by the specific design of the contact areas of the wafer boat 1, such as the dimensions and shape of the contact projections.

The wafer boats 100, 200 and 300 provide a substantially lower thermal mass than wafer boat 1, and the substantially free-standing wafers can be heated more easily. In the region of the supports 102, 104 and the plates 202, 204, electrically conductive spacers can be used, in order to provide local additional heating during the heating phase. In particular, a counterbalance may be provided for the thermal mass of the supports and the plates, which are not present in the free-standing wafer region. The wafer boat 300 allows another layout of wafers, which, in particular in the case of an unchanged process chamber, allows the insertion of bigger wafers.

The treatment apparatus 30 and the wafer boat 1 have been described on the basis of specific embodiments of the invention with reference to the drawings, without being limited to the specifically shown embodiments. In particular, the gas supplies 44, 46 could be of different shapes or could be arranged differently, as is also indicated in FIGS. 7-9. Also plates 6 of the wafer boat 1 can have other dimensions and in particular can be dimensioned for holding another number of wafers. The treatment apparatus is shown in a horizontal orientation and this represents a preferred design. However, most of the advantageous aspects of the present application are also valid for a vertical chamber with a vertically positioned tube element, wherein in this case position references such as above, below should be changed accordingly to lateral position references. This is particularly valid for the gas guide tubes with reference to the wafer boat and a mounting space for these tubes.

The invention claimed is:

1. Wafer boat for the plasma treatment of disc-shaped wafers, in particular semiconductor wafers for semiconductor or photovoltaic applications, comprising:
   a plurality of plates positioned parallel to one another made of an electrically conductive material, and each having at least one carrier for a wafer on each side facing another plate, which define a receiving space for wafers on the plates;
   a plurality of spacer elements, which are positioned between directly adjacent plates in order to position the plates parallel to each other;
   wherein the spacer elements are electrically conductive, and wherein each spacer element engages the adjacent plates such that current flows between the adjacent plates through the spacer elements.

2. Wafer boat according to claim 1, wherein the spacer elements are evenly distributed around the receiving space for wafers on the plates.

3. Wafer boat according to claim 1, wherein in each case at least four of the spacer elements are distributed around a respective receiving space for wafers on the plates.

4. Wafer boat according to claim 1, wherein the resistance of the spacer elements is such that when the wafer boat is supplied with a high-frequency voltage, only a part of the high-frequency power introduced into the spacer elements is transformed into heat.

5. Wafer boat according to claim 1, wherein each of the spacer elements has a resistance of at least 20 kΩ, and preferably in the region of 40 kΩ.

6. Wafer boat according to claim 1, wherein the spacer elements are made of polysilicon, and wherein a resistance of the spacer elements is set by doping the base material.

7. Wafer boat according to claim 6, wherein the combined thermal mass of the sum of the contact blocks and the sum of the contact projections is smaller than the thermal mass of the rest of the wafer boat.

8. Wafer boat according to claim 1, wherein the plates each have contact projections at their longitudinal ends which are connected via contact blocks with the contact projections of other plates, wherein the contact projections of directly adjacent plates are located on different height levels, and wherein the contact blocks connect every second one of the plates, respectively.

9. Wafer boat according to claim 8, wherein the combined thermal mass of the sum of the contact blocks and the sum of the contact projections is smaller than $1/10$ of the thermal mass of the rest of the wafer boat.

10. Wafer boat according to claim 8, wherein the impedance of the supply path over contact blocks and two contact projections in which electrical current flows is smaller than the impedance of a plasma which is burning during operation between a wafer pair which is in contact with the contact projections.

11. Plasma treatment apparatus for wafers, in particular semiconductor wafers, comprising:
  a process chamber for holding a wafer boat according to claim 1;
  a controller for controlling or regulating a process gas atmosphere in the process chamber; and
  at least one source of voltage which is connectable with the plates of the wafer boat so as to enable a supply of an electrical voltage between directly adjacent plates of the wafer boat, wherein the at least one source of voltage is suitable for applying at least one of a DC-voltage and a low-frequency AC voltage and a high-frequency AC voltage.

12. Wafer boat according to claim 1, wherein all the plates are engaged by the spacer elements such that current flows through all the plates and all the spacer elements to heat every receiving space in the wafer boat.

13. Wafer boat according to claim 1, wherein each plate extends longitudinally between first and second ends each directly engaging at least one electrically conductive spacer element.

14. A method for the plasma treatment of wafers, in which a plurality of substrates, in particular semiconductor wafers that are received in a wafer boat including a plurality of plates positioned parallel to one another made of an electrically conductive material, and each having at least one carrier for a wafer on each side facing another plate, which define a receiving space for wafers on the plates, a plurality of spacer elements, which are positioned between directly adjacent plates in order to position the plates parallel to each other, the spacer elements being electrically conductive, each spacer element engaging the adjacent plates such that current flows between the adjacent plates through the spacer elements, wherein the plurality of substrates is inserted in the process chamber of a plasma treatment apparatus including a process chamber for holding a wafer boat, a controller for controlling or regulating a process gas atmosphere in the process chamber, and at least one source of voltage which is connectable with the plates of the wafer boat in a suitable manner, in order to supply an electrical voltage between directly adjacent plates of the wafer boat, wherein the at least one source of voltage is suitable for applying at least one of a DC-voltage and a low-frequency AC voltage and a high-frequency AC voltage, wherein the method comprises:
  applying a DC-voltage or a low-frequency AC-voltage to the plates of the wafer boat during a heating phase in such a way that the spacer elements heat up due to a flow of current therethrough; and
  applying a high-frequency AC-voltage to the plates of the wafer boat, in order to generate a plasma between the wafers inserted therein during a processing phase.

15. Method according to claim 14, wherein the temperature in the process chamber is controlled or regulated, and wherein the switching between applying a DC-voltage or a low-frequency AC-voltage and applying a high-frequency AC-voltage takes place when the temperature of the wafers reaches or exceeds a pre-determined temperature.

16. Method according to claim 14, wherein the applied DC-voltage or low-frequency AC-voltage is a substantially larger voltage than the high-frequency AC-voltage.

17. Method according to claim 14, wherein the gas atmosphere in the process chamber is controlled or regulated.

* * * * *